(12) United States Patent
Phipps et al.

(10) Patent No.: US 8,172,424 B2
(45) Date of Patent: May 8, 2012

(54) HEAT SINKING AND FLEXIBLE CIRCUIT BOARD, FOR SOLID STATE LIGHT FIXTURE UTILIZING AN OPTICAL CAVITY

(75) Inventors: Michael Phipps, Springfield, VA (US); Robert M. Becker, Centreville, VA (US); Roger T. Hanley, Great Falls, VA (US); Steven S. Lyons, Herndon, VA (US); David P. Ramer, Reston, VA (US); Chad N. Sanders, Ashburn, VA (US)

(73) Assignee: ABL IP Holding LLC, Conyers, GA (US)

( * ) Notice: Subject to any disclaimer, the term of this patent is extended or adjusted under 35 U.S.C. 154(b) by 343 days.

(21) Appl. No.: 12/609,523

(22) Filed: Oct. 30, 2009

(65) Prior Publication Data
US 2010/0277907 A1    Nov. 4, 2010

Related U.S. Application Data

(63) Continuation-in-part of application No. 12/434,248, filed on May 1, 2009, now Pat. No. 8,028,537.

(51) Int. Cl.
*F21V 13/00* (2006.01)
(52) U.S. Cl. ............... 362/245; 362/235; 362/249.02
(58) Field of Classification Search ............ 362/235, 362/244, 245, 249.02, 294, 296.01, 311.02
See application file for complete search history.

(56) References Cited

U.S. PATENT DOCUMENTS

| | | | |
|---|---|---|---|
| 4,675,575 A | 6/1987 | Smith et al. | |
| 5,136,483 A | 8/1992 | Schoniger et al. | |
| 5,608,213 A | 3/1997 | Pinkus et al. | |
| 5,803,592 A | 9/1998 | Lawson | |
| 5,877,490 A | 3/1999 | Ramer et al. | |
| 5,914,487 A | 6/1999 | Ramer et al. | |
| 6,007,225 A | 12/1999 | Ramer et al. | |
| 6,222,623 B1 | 4/2001 | Wetherell | |
| 6,234,648 B1 | 5/2001 | Borner et al. | |
| 6,286,979 B1 | 9/2001 | Ramer et al. | |
| 6,357,889 B1 | 3/2002 | Duggal et al. | |
| 6,361,192 B1 | 3/2002 | Fussell et al. | |
| 6,422,718 B1 | 7/2002 | Anderson et al. | |

(Continued)

OTHER PUBLICATIONS

International Preliminary Report on Patentability (Chapter I of the Patent Cooperation Treaty) issued in International Patent Application No. PCT/US2010/028295 dated Nov. 10, 2011.

(Continued)

*Primary Examiner* — David V Bruce
(74) *Attorney, Agent, or Firm* — McDermott Will & Emery LLP

(57) ABSTRACT

Disclosed exemplary solid state light fixtures use optical cavities to combine or integrate light from LEDs or the like. In such a fixture, the cavity is formed by a light transmissive structure having a volume, and a diffuse reflector that covers a contoured portion of the structure. A circuit board has flexible tabs mounting the light emitters. A heat sink member supports the circuit board and is contoured relative to the shape of the light transmissive structure so that the tabs bend and the emitters press against a sufficiently rigid periphery of the light transmissive structure. TIM may be compressed between the heat sink member and the opposite surface of each tab. Various contours/angles of the periphery of the light transmissive structure and the mating portion of the heat sink member may be used.

26 Claims, 13 Drawing Sheets

U.S. PATENT DOCUMENTS

| | | | |
|---|---|---|---|
| 6,437,861 B1 | 8/2002 | Kuta | |
| 6,447,698 B1 | 9/2002 | Ihara et al. | |
| 6,473,554 B1 | 10/2002 | Pelka et al. | |
| 6,533,429 B2 | 3/2003 | Yoneda | |
| 6,536,914 B2 | 3/2003 | Hoelen et al. | |
| 6,566,824 B2 | 5/2003 | Panagotacos et al. | |
| 6,692,136 B2 | 2/2004 | Marshall et al. | |
| 6,700,112 B2 | 3/2004 | Brown | |
| 6,737,681 B2 | 5/2004 | Koda | |
| 6,836,083 B2 | 12/2004 | Mukai | |
| 6,869,545 B2 | 3/2005 | Peng et al. | |
| 6,872,249 B2 | 3/2005 | Peng et al. | |
| 6,960,872 B2 | 11/2005 | Beeson et al. | |
| 6,969,843 B1 | 11/2005 | Beach et al. | |
| 6,985,163 B2 | 1/2006 | Riddle et al. | |
| 6,992,317 B2 | 1/2006 | Jain et al. | |
| 6,995,355 B2 | 2/2006 | Rains, Jr. et al. | |
| 7,025,464 B2 | 4/2006 | Beeson et al. | |
| 7,040,774 B2 | 5/2006 | Beeson et al. | |
| 7,102,152 B2 | 9/2006 | Chua et al. | |
| 7,105,051 B2 | 9/2006 | Peng et al. | |
| 7,122,961 B1 | 10/2006 | Wedding | |
| 7,144,131 B2 | 12/2006 | Rains | |
| 7,148,632 B2 | 12/2006 | Berman et al. | |
| 7,153,703 B2 | 12/2006 | Peng et al. | |
| 7,160,525 B1 | 1/2007 | Peng et al. | |
| 7,192,850 B2 | 3/2007 | Chen et al. | |
| 7,220,039 B2 | 5/2007 | Ahn et al. | |
| 7,235,190 B1 | 6/2007 | Wilcoxon et al. | |
| 7,235,792 B2 | 6/2007 | Elofson | |
| 7,237,927 B2 | 7/2007 | Coushaine | |
| 7,273,904 B2 | 9/2007 | Peng et al. | |
| 7,350,933 B2 | 4/2008 | Ng et al. | |
| 7,374,807 B2 | 5/2008 | Parce et al. | |
| 7,531,149 B2 | 5/2009 | Peng et al. | |
| 7,560,677 B2 | 7/2009 | Lyons et al. | |
| 7,768,192 B2 | 8/2010 | Van De Ven et al. | |
| 7,806,556 B2 | 10/2010 | Wu | |
| 7,891,840 B1 | 2/2011 | Kang et al. | |
| 2004/0135504 A1 | 7/2004 | Tamaki et al. | |
| 2004/0151008 A1 | 8/2004 | Artsyukhovich et al. | |
| 2004/0188594 A1 | 9/2004 | Brown et al. | |
| 2004/0201995 A1 | 10/2004 | Galli | |
| 2005/0230673 A1 | 10/2005 | Mueller et al. | |
| 2005/0243558 A1 | 11/2005 | Van Duyn | |
| 2006/0072314 A1 | 4/2006 | Rains | |
| 2006/0158857 A1 | 7/2006 | Luckner et al. | |
| 2007/0045524 A1 | 3/2007 | Rains, Jr. et al. | |
| 2007/0051883 A1 | 3/2007 | Rains, Jr. et al. | |
| 2007/0138978 A1 | 6/2007 | Rains, Jr. et al. | |
| 2007/0139961 A1 | 6/2007 | Cheah et al. | |
| 2007/0170454 A1 | 7/2007 | Andrews | |
| 2007/0230164 A1* | 10/2007 | Vivenzio et al. | 362/109 |
| 2007/0230167 A1* | 10/2007 | McMahon et al. | 362/157 |
| 2007/0242441 A1 | 10/2007 | Aldrich et al. | |
| 2007/0263393 A1 | 11/2007 | Van De Ven | |
| 2008/0030974 A1 | 2/2008 | Abu-Ageel | |
| 2008/0094835 A1 | 4/2008 | Marra et al. | |
| 2008/0106887 A1 | 5/2008 | Salsbury et al. | |
| 2008/0224025 A1 | 9/2008 | Lyons et al. | |
| 2008/0291670 A1 | 11/2008 | Rains | |
| 2009/0003002 A1 | 1/2009 | Sato | |
| 2009/0295266 A1 | 12/2009 | Ramer et al. | |
| 2009/0296368 A1 | 12/2009 | Ramer | |

OTHER PUBLICATIONS

International Preliminary Report on Patentability (Chapter I of the Patent Cooperation Treaty) issued in International Patent Application No. PCT/US2010/028302 dated Nov. 10, 2011.

V. Ya. Rudyak et al., "On the Viscosity of Rarefied Gas Suspensions Containing Nanoparticles," Doklady Physics vol. 48 No. 10, 2003.

United States Notice of Allowance issued in U.S. Appl. No. 12/434,248 dated Jul. 26, 2011.

Pradhan, Narayan, et al., "An Alternative of CdSe Nanocrystal Emitters: Pure and Tunable Impurity Emissions in ZnSe nonocrystals", Nov. 24, 2005, 127, pp. 17586-17587, J. A, Chem, Soc. Communications, web publication.

"Energy Star Program Requirements for Solid State Lighting Luminaires Eligibility Criteria—Version 1.0", Manual, Sep. 12, 2007.

Yin, Yadong and A. Paul Alivisatos, "Colloidal nanocrystal sythesis and the organic-inorganic interface", Insight Review, Sep. 25, 2005, pp. 664-670, Nature vol. 437.

"Final Report: Highly Bright, Heavy Metal-Free, and Stable Doped Semiconductor Nanophosphors for Economical Solid State Lighting Alternatives", Report, Nov. 12, 2009, pp. 1-3, National Center for Environmental Research, web publication.

"Solid-State Lighting: Development of White LEDs Using Nanophosphor-InP Blends", Report, Oct. 26, 2009, p. 1, U.S. Department of Energy—Energy Efficiency and Renewable Energy, web publication.

"Solid-State Lighting: Improved Light Extraction Efficiencies of White pc-LEDs for SSL by Using Non-Toxic, Non-Scattering, Bright, and Stable Doped ZnSe Quantum Dot Nanophosphors (Phase I)", Report, Oct. 26, 2009, pp. 1-2, U.S. Department of Energy—Energy Efficiency and Renewable Energy, web publication.

"Chemistry—All in the Dope", Editor's Choice, Dec. 9, 2005, Science, vol. 310, p. 1, AAAS, web publication.

"D-dots: Heavy Metal Free Doped Semiconductor Nanocrystals", Technical Specifications, etc. Dec. 1, 2009, pp. 1-2, NN-LABS, LLC (Nanomaterials & Nanofabrication Laboratories), CdSe/ZnS Semiconductor Nanocrystals, web publication.

International Search Report and the Written Opinion of the International Searching Authority issued in International Patent Application No. PCT/US2010/028302 dated May 19, 2010.

International Search Report and the Written Opinion of the International Searching Authority issued in International Patent Application No. PCT/US2010/028285 dated May 19, 2010.

* cited by examiner

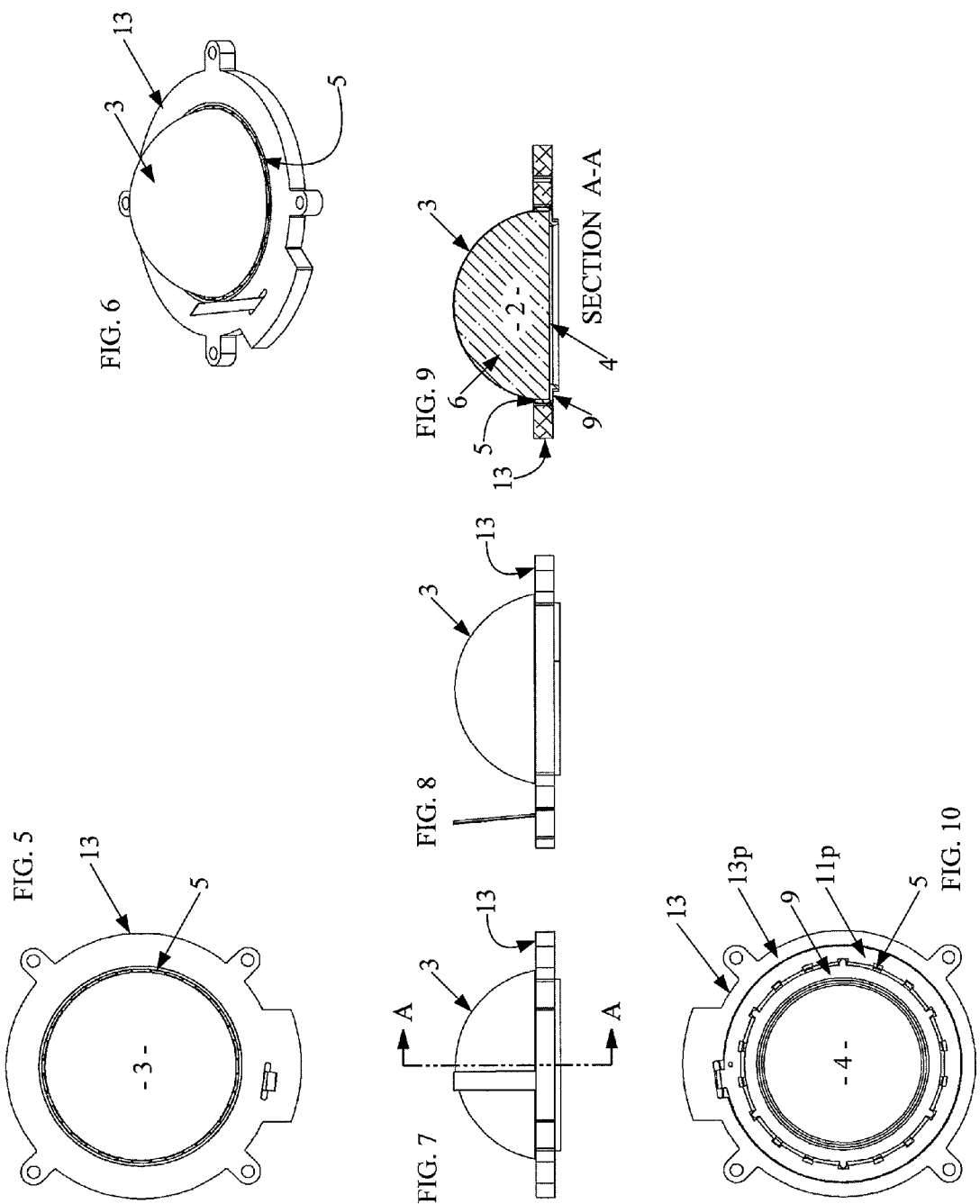

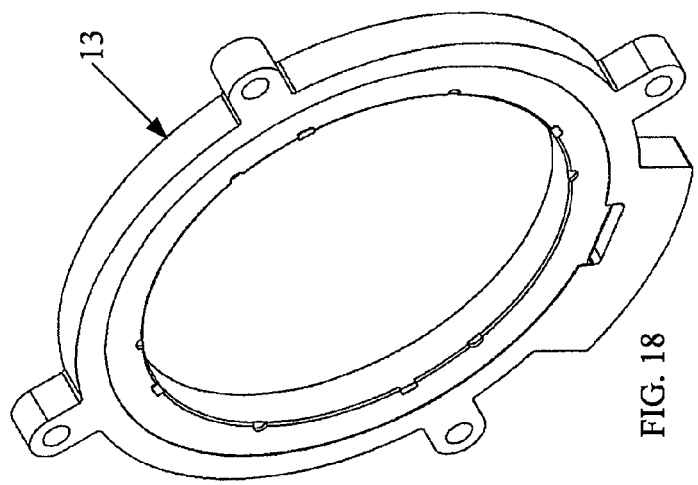
FIG. 18
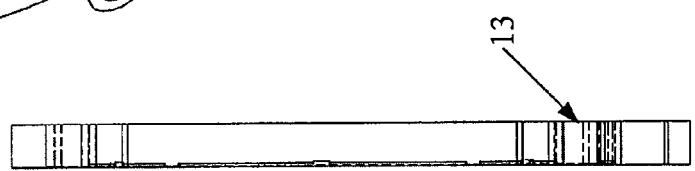
FIG. 17
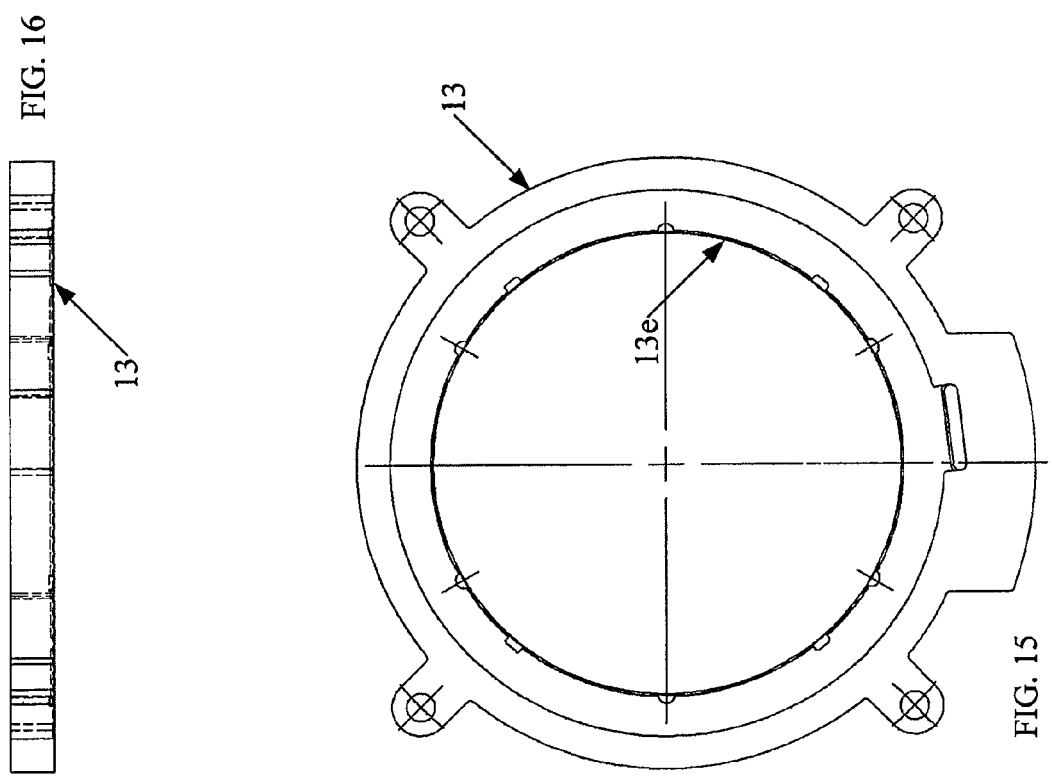
FIG. 16
FIG. 15

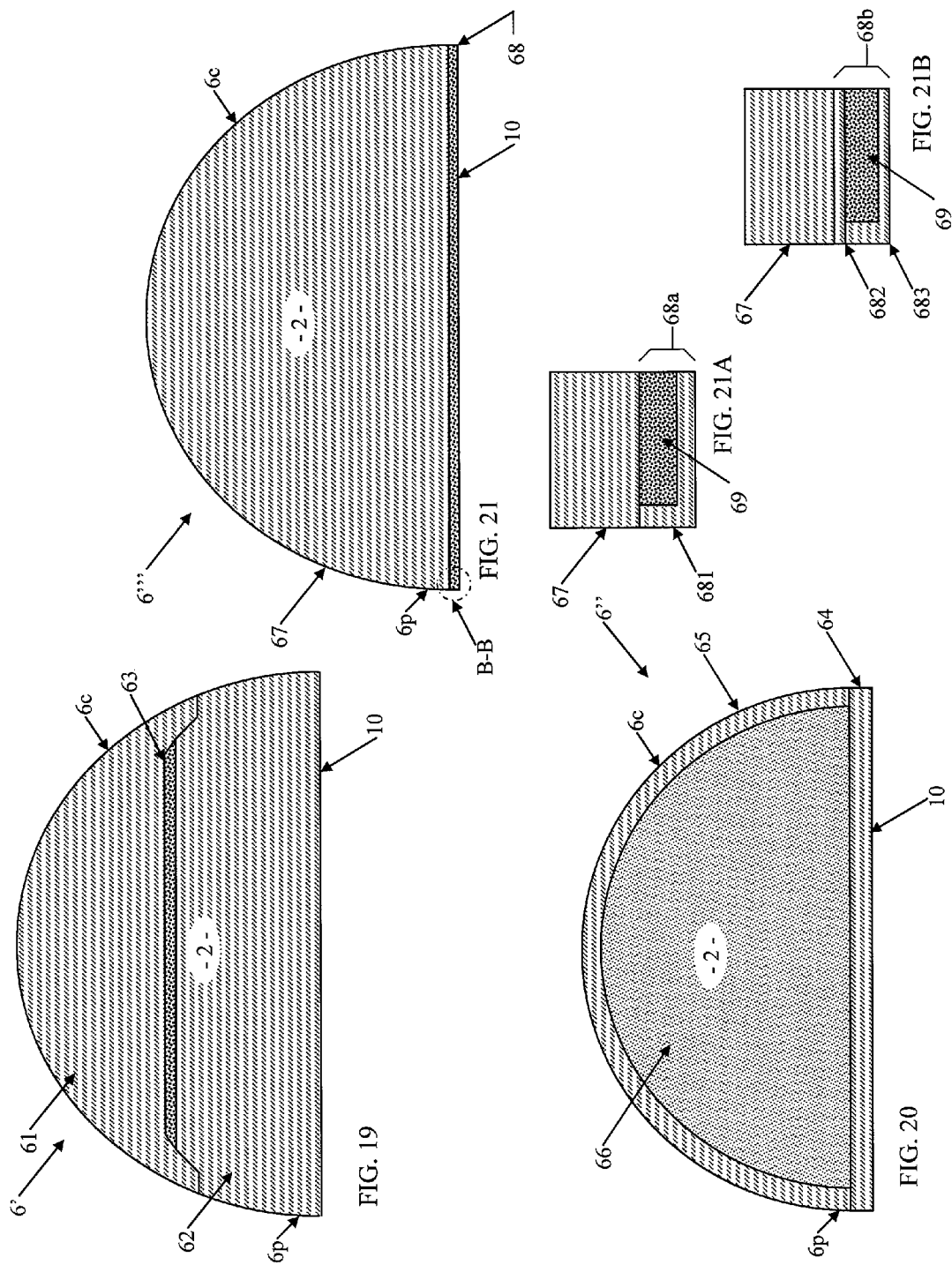

HEAT SINKING AND FLEXIBLE CIRCUIT BOARD, FOR SOLID STATE LIGHT FIXTURE UTILIZING AN OPTICAL CAVITY

RELATED APPLICATION

This application is a continuation in part of U.S. application Ser. No. 12/434,248 Filed May 1, 2009 now U.S. Pat. No. 8,028,537 entitled "Heat Sinking and Flexible Circuit Board, for Solid State Light Fixture Utilizing an Optical Cavity," the disclosure of which is entirely incorporated herein by reference.

TECHNICAL FIELD

The present subject matter relates to solid state type light fixtures each having an optical cavity formed by a light transmissive volume, which may be filled with a liquid or solid, and more specifically, to techniques for mounting the solid state light emitters in relation to the structure, electrically connecting the solid state light emitters and providing effective heat dissipation for such light emitters.

BACKGROUND

As costs of energy increase along with concerns about global warming due to consumption of fossil fuels to generate energy, there is an every increasing need for more efficient lighting technologies. These demands, coupled with rapid improvements in semiconductors and related manufacturing technologies, are driving a trend in the lighting industry toward the use of light emitting diodes (LEDs) or other solid state light sources to produce light for general lighting applications, as replacements for incandescent lighting and eventually as replacements for other older less efficient light sources.

To provide efficient mixing of the light from a number of sources and a pleasing uniform light output, Advanced Optical Technologies, LLC (AOT) of Herndon, Va. has developed a variety of light fixture configurations that utilize a diffusely reflective optical integrating cavity to process and combine the light from a number of solid state sources. By way of example, a variety of structures for AOT's lighting systems using optical integrating cavities are described in U.S. Patent Application Publications 2007/0138978, 2007/0051883 and 2007/0045524, the disclosures of which are incorporated herein entirely by reference.

Although these integrating cavity-based lighting systems/fixtures provide excellent quality light in an efficient manner and address a variety of concerns regarding other solid state lighting equipment, there is still room for improvement. For example, efficiency of the optical integrating cavity decreases if the diffuse reflectivity of its interior surface(s) is compromised, for example due to contamination from dirt or debris entering the cavity. Also, since the cavity is filled with air (low index of refraction), some light may be trapped in the LED packages by internal reflection at the package surface because the material used to encapsulate the LED chip may have a higher index of refraction. Efficiency may also be somewhat reduced if the mask or portion of the cavity around the aperture needs to have a relatively large size (producing a small optical aperture) to sufficiently reduce or prevent direct emissions from the solid state light source(s) through the cavity and optical aperture.

U.S. Patent Application Publications 2008/0094835 to Marra et al. describes a light engine having a chamber with an aperture and a number of LED elements positioned inside the chamber. Inner surfaces of the chamber are highly-reflective and essentially non-absorbing towards light within a desired wavelength region. The reflective inner surfaces are formed by a diffuse-reflective material sandwiched between a substrate/wall and a transparent covering plate. To improve efficiency of light extraction from the LEDs, the fixture may include out-coupling elements that are optically coupled between the LEDs and the transparent covering plate. Although the cavity may be empty, this publication also suggests that the cavity may be filled with a material which has a refractive index that approaches or, preferably, matches the refractive index of one or more of the other elements of the light engine, e.g. that of the transparent covering plate. As disclosed, this filler material may be an organic medium such as a transparent liquid, particularly an oil, or a solid resin, particularly a silicone resin, possessing the desired (matching) refractive index, and which is preferably substantially non-absorbing with respect to visible light and/or with respect to the light generated inside and emitted from the LED dies.

U.S. Pat. No. 7,040,774 to Beeson et al discloses an illumination system having one or more LEDs and a wavelength conversion layer within a light-recycling envelope. In some examples, the wavelength conversion layer may fill a substantial portion of the volume of the light-recycling envelope. The light from the LED source(s) is transmitted through the wavelength conversion layer in order to convert a portion of the light of a first wavelength range into light of a second wavelength range. Light of both the first and second wavelength ranges exit the light-recycling envelope through an aperture.

These developments not withstanding, in this age of ever increasing concern over energy consumption, there is always a need for techniques to still further improve efficiency of solid state lighting fixtures or systems. Also, any modification of the structure or design of the solid state light fixture must address ancillary issues, such as circuit mounting and/or heat dissipation. For example, LED type solid state emitters generate heat, and it is important to provide effective heat dissipation to avoid damage to the LEDs or associated circuitry.

SUMMARY

The teachings herein address one or more of the needs outlined above with regard to improvements in solid state light fixtures or lighting systems using a diffusely reflective optical cavity to combine or integrate light from the emitters. For example, the arrangements discussed herein provide connections to and mounting for solid state light emitters in a manner that provides efficient light coupling into the optical cavity and provides efficient heat dissipation. A flexible circuit board mounted on a heat sink member has one or more flexible tabs on which the emitter(s) are mounted. When installed in the fixture, each tab bends and the emitter(s) for example may press against a peripheral surface of a light transmissive structure forming the volume for an optical cavity.

The detailed descriptions and drawings disclose various examples of light fixtures and lighting systems, for providing general lighting in a region or area intended to be occupied by a person.

A light fixture, for example, might include a light transmissive structure forming a volume. In this example, the structure has a contoured outer surface, an optical aperture surface and a peripheral optical coupling surface between the contoured outer surface and the optical aperture surface. The peripheral optical coupling surface forms an obtuse angle with respect to the optical aperture surface. A reflector included in the fixture provides a diffusely reflective interior surface extending over at least a substantial portion of the contoured outer surface of the light transmissive structure, to form an optical cavity including the volume of the light transmissive structure. A portion of the aperture surface of the light transmissive structure forms an optical aperture for passage of light out of the cavity. The exemplary fixture also includes a heat sink member with an inner peripheral portion of a size somewhat larger than the outer peripheral portion of the light transmissive structure. This heat sink member has an inner surface at an angle at least substantially corresponding to the angle formed by the peripheral optical coupling surface of the light transmissive structure. The exemplary fixture also includes a flexible circuit board, which has a mounting section mounted on the heat sink member, and at least one flexible tab attached to and extending from the mounting section. Each flexible tab bends around the heat sink member into a position between the angled inner surface of the inner peripheral portion of the heat sink member and the angled peripheral optical coupling surface of the light transmissive structure. The fixture also has one or more solid state light emitters, for producing light intensity sufficient for a general lighting application of the fixture. At least one solid state light emitter is mounted on a respective tab of the flexible circuit board. The respective tab positions the emitter it supports between the tab and the angled peripheral optical coupling surface of the outer peripheral portion of the light transmissive structure. The tab holds the solid state light emitter against the peripheral optical coupling surface of the light transmissive structure for emission of light through that surface into the volume formed by the light transmissive structure.

The detailed disclosure also describes a variety of features that may be incorporated into different examples of such a fixture or light engine. For example, at least a substantial portion of the contoured outer surface of the light transmissive structure has a roughened or etched texture. In such an implementation, at least any portion of the angled peripheral optical coupling surface of the light transmissive structure receiving light from the one or more solid state light emitters likely would be highly transparent. Although the aperture surface may be highly transparent, it is also contemplated that at least a substantial portion of the optical aperture surface of the light transmissive structure has a roughened or etched texture.

In some examples of the light fixture, there are one or more vias formed through each respective tab, from a first surface of the respective tab supporting the solid state light emitter to an opposite second surface of the respective tab. Heat conductive material extends through each via from the first surface to the second surface of the respective tab, to conduct heat from each solid state emitter on the respective tab. In a typical implementation of such an exemplary circuit board, heat conductive pads are also formed on the first and second surfaces of each tab. The heat conductive pad on the first surface contacts each light emitter on the respective tab; and the heat conductive pad on the second surface transfers heat to the heat sink member. The heat conductive material extending through each via through each respective tab conducts heat from each solid state emitter on the respective tab, from the first pad on the respective tab to the second pad on the respective tab for transfer to the heat sink member.

The fixture may also include thermal interface material (TIM) positioned between the respective tab and the angled inner surface of the inner peripheral portion of the heat sink member. The TIM may provide electrical insulation between the tabs and the heat sink member, for example, for an implementation in which a heat slug of an emitter is conductive. The TIM, however, also provides thermal conductivity to the heat sink member. In such an example, pressure created by contact of at least one solid state light emitter with the angled outer peripheral optical coupling surface of the light transmissive structure compresses the TIM against the heat sink member.

In current implementations, a fixture includes a plurality of solid state light emitters which typically are light emitting diodes (LEDs). Various combinations of different colors of LEDs may be used, for example RGB LEDs or combinations of white LEDs with other LEDs. In the illustrated example of the circuitry, each LED is a white LED.

The present discussion encompasses a variety of different structural configurations for the light transmissive structure. Several examples are shown and described in which the light transmissive structure comprises a light transmissive solid substantially filling the volume of the light transmissive structure. Materials containing phosphors may be provided within or around the solid. For example, the structure may utilize two pieces of the light transmissive solid with a gap therebetween, filled with a phosphor or phosphor bearing material. Such an arrangement may position the phosphor somewhat near the middle of the volume of the light transmissive structure, or at least one of the light transmissive sections may be located at the optical aperture surface of the light transmissive structure, so as to position the phosphor at or near the optical aperture. As another alternative, the light transmissive structure may comprise a container. Although the container could be filled with a gas, in an illustrated example, the container is filled with a liquid. The liquid may contain a phosphor, such as one or more nano phosphors.

In the illustrated examples, the diffuse reflections of light within the volume of the light transmissive structure optically integrate light from the solid state light emitters. The fixture emits optically integrated light through the optical aperture, at the aperture surface of the light transmissive structure. In the examples, the emissions through the aperture create a virtual source of light at the aperture, exhibiting substantially uniform light intensity across the area of the aperture.

In some examples, each tab holds one or more light emitters against the peripheral optical coupling surface of the light transmissive structure for emission of light through the peripheral optical coupling surface. The orientation of each emitter is such that the aperture surface of the light transmissive structure reflects a portion of direct emissions from the solid state light emitter back into the optical cavity by total internal reflection, for subsequent diffuse reflection off of the reflector for optical integration within the cavity before emission through the optical aperture.

In some examples shown, the tabs hold light emitters against the outer peripheral portion along the contoured surface of the light transmissive structure in such an orientation that the central axis of emission of each light emitter is substantially at a right angle to the perpendicular axis of the aperture surface of the light transmissive structure and therefore substantially parallel to the aperture surface of the light transmissive structure. In other examples, the respective tab holds at least one solid state light emitter in such an orientation that the central axis of emission of the light emitter is substantially at an acute angle relative to the axis of the aperture surface of the light transmissive structure and inclined somewhat away from the aperture surface of the light transmissive structure. In one specific example, the obtuse angle of the peripheral optical coupling surface with respect to the optical aperture surface of light transmissive structure is approximately 120° and the acute angle of the central axis of emission of each light emitter relative to the axis of the aperture surface of the light transmissive structure approximately 60°.

The light fixture may include a mask having a reflective surface facing inward with respect to the volume, covering a portion of the aperture surface of the light transmissive structure in proximity to the solid state light emitters. The optical aperture is formed by a portion of the aperture surface not covered by the mask. However, the arrangement of the aperture surface and the emitters to facilitate reflection of direct emissions via TIR allows use of a relatively narrow mask, or in some configurations may allow elimination of the additional mask, yet still enable sufficient diffuse reflections within the cavity/volume as to provide adequate optical integration of the light from the emitters, e.g. to provide the virtual source output at the aperture.

The volume of the light transmissive structure, and thus the optical cavity of the fixture, may have any shape providing adequate reflections within the volume/cavity for a particular application. Examples having shapes corresponding to a portion or segment of a sphere or cylinder are preferred for ease of illustration and/or because curved surfaces provide better efficiencies than other shapes that include more edges and corners which tend to trap light. Hence, in the illustrated examples, the volume of the light transmissive structure has a shape corresponding to a substantial section of a sphere, e.g. a hemisphere. The outer peripheral portion of the structure along the contoured surface of the light transmissive structure is circular, as are the inner peripheral portion of the mounting section of the flexible circuit board and the inner peripheral portion of the heat sink member.

To further improve efficiency, it may help with coupling of light from the emitters into the light transmissive solid to provide an optical grease, glue or gel between the peripheral optical coupling surface and at least one solid state light emitter. This material eliminates air gaps and/or provides refractive index matching relative to a material of the light transmissive structure, for example, the material forming the angled peripheral optical coupling surface of the light transmissive structure.

The present disclosure also encompasses various solid state lighting systems. An example of such a system might include a light fixture and drive circuitry. For example, the fixture might include a light transmissive structure forming a volume. The structure has a contoured outer surface and an optical aperture surface. A reflector included in the fixture provides a diffusely reflective interior surface extending over at least a substantial portion of the contoured outer surface of the light transmissive structure, to form an optical cavity including the volume of the light transmissive structure. A portion of the aperture surface of the light transmissive structure forms an optical aperture for passage of light out of the cavity. The fixture also includes a heat sink member having an inner peripheral portion of a size somewhat larger than an outer peripheral portion of the light transmissive structure. The inner peripheral portion of the heat sink member has an inner surface at least substantially conforming in shape to the outer peripheral portion of the light transmissive structure. In this exemplary system, the fixture also includes a flexible circuit board. Here, the flexible circuit board has a mounting section mounted on the heat sink member and a strip extending from the mounting section of the flexible circuit board providing electrical connections to the drive circuitry. The flexible circuit board also includes at least one flexible tab attached to and extending from the mounting section of the flexible circuit board. Each flexible tab bends around the heat sink member to position a portion of the tab that supports a solid state light emitter between the inner surface of the inner peripheral portion of the heat sink member and the outer peripheral portion of the light transmissive structure. One or more solid state light emitters are capable of producing light intensity sufficient for a general lighting application of the fixture. A respective tab holds at least one solid state light emitter against the outer peripheral portion of the light transmissive structure for emission of light into the volume formed by the light transmissive structure.

The exemplary arrangements hold the solid state light emitters in a manner that allows improved optical performance as well as efficient heat dissipation. Also, the combination of the heat sink member and the flexible circuit board, sized appropriately in relation to the peripheral portion of the light transmissive structure facilitates assembly of the light fixture during manufacture.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 5 is a top plan view of an LED type light fixture, illustrating a product that embodies a number of the concepts discussed herein.

FIG. 6 is an isometric view of the LED type light fixture of FIG. 5.

FIG. 7 is an end view of the LED type light fixture of FIG. 5.

FIG. 8 is a side view of the LED type light fixture of FIG. 5.

FIG. 9 is a cross-sectional view of the LED type light fixture of FIG. 5, taken along line A-A of the end view of FIG. 7.

FIG. 10 is a bottom view of the LED type light fixture of FIG. 5.

FIG. 15 is a bottom plan view of the heat sink ring of the LED type light fixture of FIG. 5.

FIG. 16 is an end view of the heat sink ring of FIG. 15.

FIG. 17 is a side view of the heat sink ring of FIG. 15.

FIG. 18 is an isometric view of the heat sink ring of FIG. 15.

FIG. 19 is a cross-sectional view of an alternative construction of the light transmissive structure, for use in the fixture of FIG. 1, in which the structure is formed of two transmissive solid members with a phosphor filled gap formed therebetween.

FIG. 20 is a cross-sectional view of an alternative construction of the light transmissive structure, for use in the fixture of FIG. 1, in which the structure is formed of a liquid-filled container forming the volume and optical cavity.

FIG. 21 is a cross-sectional view of yet another alternative construction of the light transmissive structure, for use in the fixture of FIG. 1, in which the light transmissive structure contains a phosphor at or near the aperture surface.

FIGS. 21A and 21B are detailed views of the cross-section in region B-B of FIG. 21, wherein the phosphor containment at or near the aperture is implemented in two somewhat different ways.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Various concepts discussed below relate to heat sink and circuit board arrangements for solid state type light fixtures. Each fixture has an optical cavity formed by a light transmissive volume, which for example may be filled with a liquid or a solid, and a reflector covering a substantial portion of a contoured surface of the light transmissive structure that forms the volume of the cavity. A flexible circuit board is mounted on a heat sink member. One or more tabs of the flexible circuit board provide support and electrical connection for one or more solid state light emitters. When installed in the fixture, each tab bends to locate the emitter(s) between the light transmissive structure and the tab/heat sink member. In the examples, variations of this arrangement press one or more of the solid state light emitters against a periphery of the light transmissive structure forming the volume for the optical cavity. In at least one example, the periphery comprises an angled surface. The emitter contact provides optical coupling of light from each emitter into the optical volume for diffuse reflection in the cavity. However, the positioning between the light transmissive structure and the heat sink member also facilitates heat transfer from the emitters to the heat sink, and thus dissipation of the heat generated during operation of the light fixture.

Figure 1:
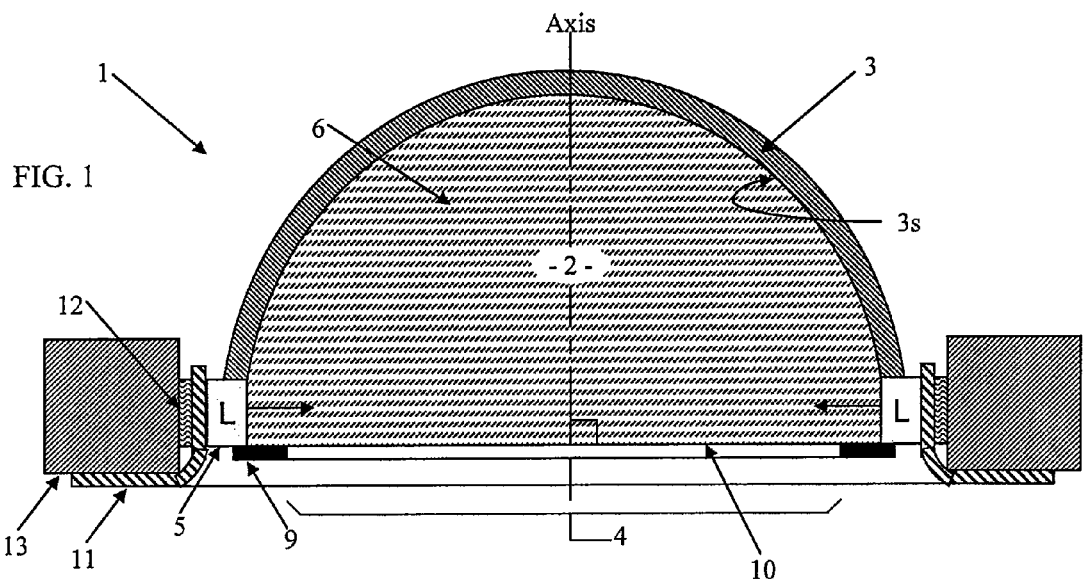
FIG. 1 is a cross-sectional view of a solid state light fixture, having a solid-filled optical integrating cavity, which is useful in explaining several of the concepts discussed herein.
Figure 2:
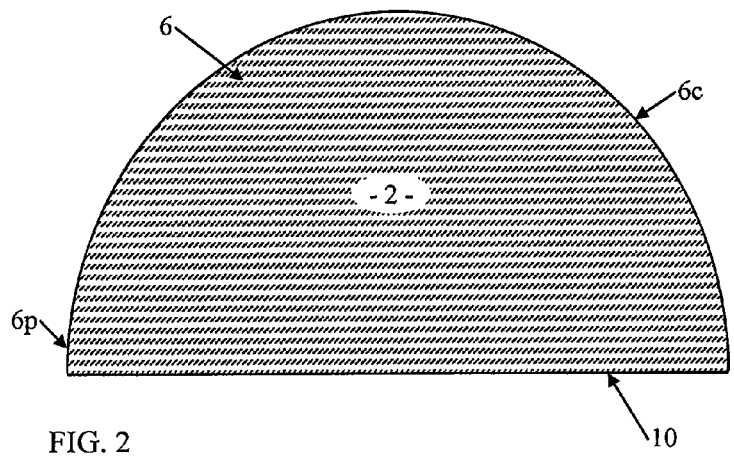
FIG. 2 is a cross-sectional view of a one-piece solid construction of the light transmissive structure, used in the fixture of FIG. 1.
Figure 3:
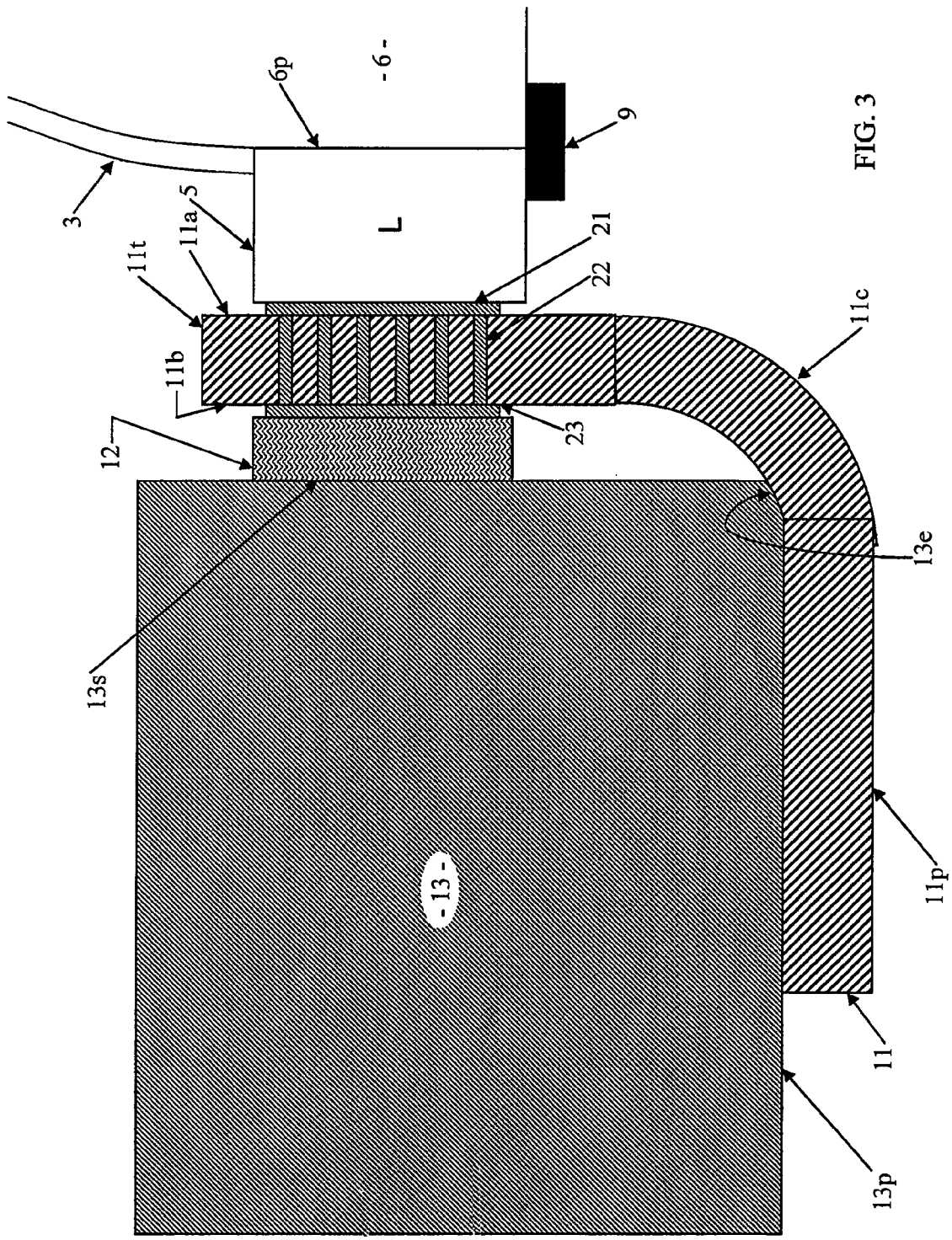
FIG. 3 is an enlarged portion of the cross-section of the fixture of FIG. 1, showing several elements of the fixture in more detail.
Figure 4:
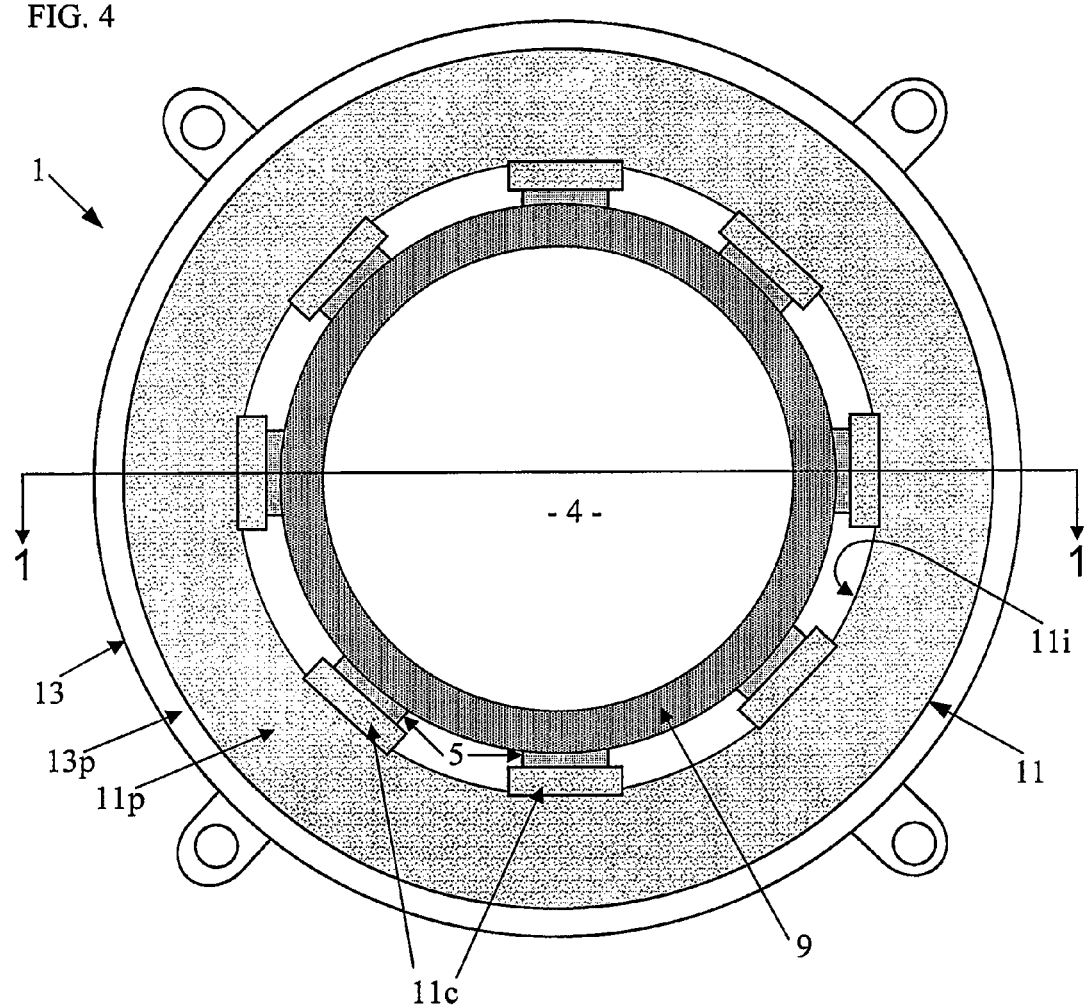
FIG. 4 is a bottom view of the solid state light fixture of FIG. 1.

Reference now is made in detail to the examples illustrated in the accompanying drawings and discussed below. FIG. 1 is a somewhat stylized representation of a cross-section of a first example of a light fixture or "light engine" apparatus 1 intended for general lighting, for example, in a region or area intended to be occupied by a person. FIG. 2 is a cross-sectional view of a one-piece solid construction of the light transmissive structure 6 that forms the optical volume 2, in the fixture 1 of FIG. 1. FIG. 3 is a detailed/enlarged view of a portion of the general lighting fixture 1, useful in explaining aspects of the flexible circuit board 11 and heat sink member 13. FIG. 4 is a bottom view ('bottom' in terms of the exemplary downlight orientation of FIG. 1) of the light fixture 1. These and other drawings are not drawn to scale. In most of the examples, for convenience, the lighting apparatus is shown in an orientation for emitting light downward. However, the apparatus may be oriented in any desired direction to perform a desired general lighting application function.

Examples of general lighting applications include downlighting, task lighting, "wall wash" lighting, emergency egress lighting, as well as illumination of an object or person in a region or area intended to be occupied by one or more people. A task lighting application, for example, typically requires a minimum of approximately 20 foot-candles (fcd) on the surface or level at which the task is to be performed, e.g. on a desktop or countertop. In a room, where the light fixture 1 is mounted in or hung from the ceiling or wall and oriented as a downlight, for example, the distance to the task surface or level can be 35 inches or more below the output of the light fixture. At that level, the light intensity will still be 20 fcd or higher for task lighting to be effective.

The fixture 1 includes a light transmissive structure 6 forming a volume 2. As shown in FIG. 2, the structure 6 has a contoured outer surface 6c and an optical aperture surface 10. At least an outer peripheral portion 6p of the structure 6 along the contoured surface 6c is substantially rigid. The contoured surface 6c, at least in regions where there is no contact to a solid state light emitter 5, has a roughened or etched texture.

As discussed in detail with regard to FIGS. 1 to 4, but applicable to all of the examples, hemispherical shapes for the light transmissive structure and volume are shown and discussed, most often for convenience. Hence, in the example of FIGS. 1 to 4, contoured outer surface 6c approximates a hemisphere, and the optical aperture surface 10 approximates a circle. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the light transmissive structure, and thus the optical cavity of the fixture, may have any shape providing adequate reflections within the volume/cavity for a particular application.

Hence, the exemplary fixture 1 uses a structure 6 forming a substantially hemispherical optical volume 2. When viewed in cross-section, the light transmissive structure 6 therefore appears as approximately a half-circle. This shape is preferred for ease of modeling, but actual products may use somewhat different curved shapes for the contoured portion 6c. For example, the contour may correspond in cross section to a segment of a circle less than a half circle or extend somewhat further and correspond in cross section to a segment of a circle larger than a half circle. Also, the contoured portion 6c may be somewhat flattened or somewhat elongated relative to the illustrated axis of the aperture 4, the aperture surface 10 and the exemplary solid 6 (in the vertical direction in the exemplary downlight orientation depicted in FIGS. 1 and 2).

In the example, the aperture surface 10 is shown as a flat surface. However, those skilled in the art will recognize that this surface 10 may have a convex or concave contour. Typically, the surface 10 is clear-transparent, although the surface could have a diffusely translucent finish or be covered by a transmissive white diffuser or the like.

Although other arrangements of the light transmissive structure are discussed more, later, in this first example, the light transmissive structure forming the volume 2 comprises a one piece light transmissive solid 6 substantially filling the volume 2. Materials containing phosphors may be provided within or around the solid, as will be discussed more, later. In the example of FIGS. 1 to 4, the solid 6 is a single integral piece of light transmissive material. The material, for example, may be a highly transmissve and/or low absorption acrylic having the desired shape. In this first example, the light transmissive solid structure 6 is formed of an appropriate glass.

The glass used for the solid of structure 6 in the exemplary fixture 1 of FIG. 1 is at least a BK7 grade or optical quality of glass, or equivalent. For optical efficiency, it is desirable for the solid structure 6, in this case the glass, to have a high transmissivity with respect to light of the relevant wavelengths processed within the optical cavity 2 and/or a low level of light absorption with respect to light of such wavelengths. For example, in an implementation using BK7 or better optical quality of glass, the highly transmissive glass exhibits 0.99 internal transmittance or better (BK7 exhibits a 0.992 internal transmittance).

The fixture 1 also includes a reflector 3, which has a diffusely reflective interior surface 3s extending over at least a substantial portion of the contoured outer surface 6c of the light transmissive structure 6. For optical efficiency, there is little or no air gap between the diffusely reflective interior surface 3s of the reflector 3 and the corresponding portion(s) of the contoured outer surface 6c of the light transmissive structure 6. In this way, the diffuse reflective surface 3s forms an optical cavity from and/or encompassing the volume 2 of the light transmissive structure 6, with an optical aperture 4 formed from a portion or all of the aperture surface 10 of the light transmissive structure 6.

It is desirable that the diffusely reflective surface(s) 3s of the reflector 3 have a highly efficient reflective characteristic, e.g. a reflectivity equal to or greater than 90%, with respect to the relevant wavelengths. Diffuse white materials exhibiting 98% or greater reflectivity are available, such as Spectralon® and Duraflect®. The illustrated example of FIGS. 1 to 4 utilizes Valar® as the reflector 3. Valar® initially comes in flat sheet form but can then be vacuum formed into desired shapes, in this case, into a dome shape conforming to the contoured outer surface 6c of the light transmissive structure 6. Those skilled in the art will recognize that other materials may be utilized to construct the reflector 3 to have the desired shape and optical performance. Various reflective paints, powders and sheet materials may be suitable. The entire interior surface 3s of the reflector 3 may be diffusely reflective, or one or more substantial portions may be diffusely reflective while other portion(s) of the surface may have different light reflective characteristics, such as a specular or semi-specular characteristic.

At least a portion 4 (FIG. 1) of the aperture surface 10 of the light transmissive structure 6 serves as a transmissive optical passage or effective "optical aperture" for emission of integrated light, from the optical integrating volume 2, in a direction to facilitate the particular general lighting application in the region or area to be illuminated by the light fixture (generally downward and/or outward from the fixture in the orientation of FIG. 1). The entire surface 10 of the solid structure 6 could provide light emission. However, the example of FIG. 1 includes a mask 9 having a reflective surface facing into the optical integrating volume 2, which somewhat reduces the surface area forming the transmissive passage to that portion of the surface shown at 4. The optical volume 2 operates as an optical integrating cavity (albeit one filled with the light transmissive solid of structure 6), and the passage 4 for light emission forms the optical aperture of that cavity.

As noted, the surface of the mask 9 that faces into the optical integrating volume 2 (faces upward in the illustrated orientation) is reflective. That surface may be diffusely reflective, much like the surface 3s, or that mask surface may be specular, quasi specular or semi-specular. Other surfaces of the mask 9 may or may not be reflective, and if reflective, may exhibit the same or different types/qualities of reflectivity than the surface of the mask 9 that faces into the optical integrating volume 2.

In the example, the light fixture 1 also includes one or more solid state light emitters 5, which provide light intensity sufficient for a particular general lighting application intended for the light fixture. An emitter 5 may be any appropriate type of light emitting semiconductor based device. In the specific examples discussed herein the solid state light emitters are light emitting diodes (LEDs). The present teachings encompass use of various types/colors of LEDs, such as red (R), green (G) and blue (B) LEDs, ultraviolet (LEDs) to pump phosphors in the fixture, LEDs of two or more different color temperatures of white light, etc. Various combinations of different colors of LEDs may be used. However, for simplicity, the discussion of this example will assume that the LED type solid state light emitters 5 are white light LEDs rated to all emit the same color temperature of white light. Hence, in the illustrated example of the circuitry (FIG. 35 as discussed, later), each LED is a white LED of the same or similar model. As noted, there may be as few as one solid state emitter, however, for illustration and discussion purposes, we will assume in most instances below that the fixture includes a plurality of solid state emitters.

An optical grease, glue or gel of an appropriate refractive index may be applied between the light emitting surfaces of the LED type solid state emitters 5 and the corresponding segments of the outer peripheral portion 6p along the contoured surface 6c of the light transmissive structure 6. Use of such a grease may improve optical extraction of light from the package encapsulating the LED chip and thus the coupling of light from each emitter into the light transmissive structure 6.

The exemplary light fixture 1 also includes a flexible circuit board 11. As shown in greater detail in FIG. 3, the flexible circuit board 11 has a mounting section or region 11p that is at least substantially planar (and is therefore referred to herein as a "planar" mounting section) for convenience in this example. As shown in the bottom view of FIG. 4, the planar mounting section 11p has an inner peripheral portion 11i. In this first example, the solid forming the light transmissive structure 6 is roughly or substantially hemispherical, and the lower periphery is circular. The inner peripheral portion 11i of the flexible circuit board 11 has a shape substantially similar to the shape of the outer periphery 6p of the light transmissive structure 6, that is to say a circular shape in the example. The circular inner peripheral portion 11i of the flexible circuit board 11 has a size slightly larger than the circular outer peripheral portion of the light transmissive structure 6. The flexible circuit board 11 also has flexible tabs 11t (FIGS. 1 and 3) attached to and extending from the inner peripheral region of the flexible circuit board 11. As is shown in FIGS. 3 and 4, a portion 11c of each tab forms a curve.

The number and type of LED type solid state light emitters 5 used in the fixture are selected so as to produce light intensity sufficient for a general lighting application of the fixture 1. The emitters 5 are mounted on the tabs 11t. At least one of the solid state light emitters 5 is mounted on a first surface 11a of each of the tabs 11t of the flexible circuit board 11.

The fixture 1 also includes a heat sink member 13. The heat sink member 13 is constructed of a material with good heat conduction properties and sufficient strength to support the flexible circuit board and associated LED light emitters, typically a metal such as aluminum. Although not shown, cooling fins may be coupled to the heat sink member 13.

As noted earlier, a fixture of the type under consideration here may include only one solid state emitter. In such a case, the flexible circuit board may have only one tab supporting the one emitter. Alternatively, the board may have more tabs, either supporting other elements, such as one or more sensors, or provide spacers for proper alignment of the board and heat sink member in relation to the light transmissive solid. Since we are mainly discussing examples having some number of (plural) emitters, each illustrated example also includes a number of flexible tabs.

The heat sink member 13 has an inner peripheral portion of substantially similar shape and of a size slightly larger than the outer peripheral portion 6p of the light transmissive structure 6, in this case, a circular inner peripheral portion. Hence, in the example of FIGS. 1 to 4, the heat sink member 13 is essentially a ring configured to surround the light transmissive structure 6. The inner periphery of the heat sink member 13, e.g. at inner edge 13e and/or surface 13s, corresponds in shape to the shape of the outer periphery 6p of the light transmissive structure 6. The outer periphery of the heat sink member 13 may have any convenient shape, although in the example, it is essentially circular with a number of eyelets for screws or other fasteners to mount the fixture (see FIG. 4).

The ring shaped heat sink member 13 in the example is a single solid member. Those skilled in the art will realize that other configurations may be used. For example, there may be a cut on one side of the ring and a tightening member (e.g. screw or bolt) attached through extensions or shoulders on either side of the cut to provide adjustment or tightening of the ring shaped heat sink member 13 around the outer periphery of the hemispherical light transmissive structure 6. Another approach would be to utilize a two or three piece arrangement of the heat sink member 13 with fasteners to couple the pieces of the member to form the ring around the outer periphery of the hemispherical light transmissive structure 6. A variety of shapes/contours may be used for the heat sink member instead of the relatively flat or planar ring shown and discussed by way of example here.

As assembled to form the light fixture 1, the planar mounting section 11p of the flexible circuit board 11 is mounted on an attachment surface 13p of the heat sink member 13 having an inner edge 13e (corresponding to junction between surfaces 13s and 13p) at the inner peripheral portion of the heat sink member 13. The attachment surface 13p of the heat sink member 13 is substantially planar (and is therefore referred to as a "planar" surface), for convenience in this example. The planar mounting section 11p of the flexible circuit board 11 may be attached to the planar attachment surface 13p of the heat sink member 13 by an adhesive or glue or by any other cost-effective means. As described herein substantially planar surfaces or regions, such as "planar" surfaces 13p and/or 13s and the "planar" region 11p of the flexible circuit board 11, need not be perfectly flat but may be somewhat contoured, curved and/or textured. Also, although surfaces and/or sections such as 13p and 13s and 11p and 11t are shown at right angles, these angles are not critical, and the elements may be constructed at somewhat different angles as may be convenient for use with a transmissive structure 6 of a particular shape and/or to facilitate easy or efficient assembly of the light fixture 1.

The flexible tabs 11t are bent at a substantial angle with respect to the planar mounting section 11p, around the inner edge 13e of the surface 13p of the heat sink 13, by pressure of the solid state emitters 5 mounted on the tabs 11t against the outer peripheral portion 6p along the contoured surface 6c of the light transmissive structure 6. In the example of FIGS. 3 and 4, the tabs bend to form curved regions 11c around the edge 13e. A second surface 11b of each respective one of the tabs, opposite the first surface 11a of the respective tab, provides heat transfer to the heat sink member, to permit heat transfer from each solid state emitter on each respective tab to the heat sink member.

In the example of FIGS. 1 to 4, the fixture 1 also includes thermal interface material (TIM) 12 positioned between the second surface 11b of each tab 11t and a corresponding inner surface 13s of the heat sink member 13. The TIM 12 provides electrical insulation between the tabs 11t and the heat sink member 13, for example, for an implementation in which the heat slug of the emitter 5 is conductive. The TIM 12, however, also provides thermal conductivity to the heat sink member 13. In the examples, pressure created by contact of the solid state light emitters 5 with the outer peripheral portion 6p of the light transmissive structure 6 compresses the TIM 12 against the surface 13s of the heat sink member 13.

Any of a variety of different techniques may be used to facilitate heat transfer from the emitter(s) 5 on a respective tab around, over or through the tab to the heat sink member 13. In the example of the light fixture 1, there are one or more vias formed through each respective tab 11t, from the first surface 11a of the respective tab to the second surface 11b of the respective tab 11t (FIG. 3). Heat conductive material 22 may extend through each via from the first surface 11a of the respective tab 11t to the second surface 11b of the respective tab, to conduct heat from each solid state emitter 5 on the respective tab 11t. In a typical implementation, heat conductive pads 21 and 23 are also formed on the first and second surfaces 11a and 11b of each tab 11t. The heat conductive pad 21 on the first surface 11a contacts the heat slug of the emitter 5 on the respective tab 11t. The heat conductive pad 23 on the second surface 11b contacts the surface 13s of the heat sink member 13. The heat conductive material 22 extending through the vias through the tab 11t conducts heat from each solid state emitter on the respective tab 11t, from the first pad 21 on the respective tab to the second pad 23 on the respective tab for transfer to the heat sink member 13, in this case, through the compressed TIM 12.

When assembled to form the light fixture 1, the angle between the tab end 11t holding the light emitter 5 with respect to the planar mounting section 11p of the flexible circuit board in the example roughly approaches a right angle. However, this angle is somewhat arbitrary. Different angles will be used in actual fixtures, particularly for different shapes of the structure 6 and/or the heat sink member 13. The angle may be somewhat acute or somewhat obtuse but is sufficient for the tabs 11t to appropriately position and hold the solid state light emitters 5 against the outer peripheral portion 6p along the contoured surface 6c of the light transmissive structure 6. The positioning of each emitter 5 provides an orientation in which a central axis of emission of the respective light emitter (shown as an arrow from each LED (L) in FIG. 1) is at a substantial angle with respect to the perpendicular axis of the aperture 4 and/or the aperture surface 10 of the light transmissive structure 6.

The angle of emission with respect to the aperture axis may be approximately perpendicular (90°) as in the example, although obtuse or acute angles may be used. For example, with appropriate contours for the solid 6 and the heat sink member 13, it may be possible to aim the emitters 5 more toward the back of the reflector 3 (upward in the illustrated orientation), and the angle of direct emissions with respect to the illustrated axis might approach 45°. The intent, however, is for relatively little of the direct emissions to impact the optical aperture surface 10 at a steep angle. At least in the region 4 forming the actual aperture, those direct light emissions that impact the surface 10 impact at a relatively shallow angle. The ambient environment outside the fixture 1, e.g. air or water at the aperture surface 10, exhibits a low index of refraction. As a result, the light transmissive solid 6 has an index of refraction higher than the ambient environment. Hence, at least the portion 4 of the aperture surface 10 of the light transmissive solid 6 that serves as the optical aperture or passage out of the optical integrating volume 2 tends to exhibit total internal reflection with respect to light reaching that surface from within the transmissive solid 6 at relatively small angles of incidence with respect to that surface.

Light emitted at a low angle from any source 5 impacts the portion 4 of the aperture surface 10, and total internal reflection at that portion of the surface reflects the light back into the optical integrating volume 2. In contrast, light that has been diffusely reflected from regions of the surface 3s of the reflector arriving at larger angles to the surface 10 are not subject to total internal reflection and pass through portion 4 of the aperture surface 10 of the light transmissive solid 6.

The mask 9 therefore can be relatively small in that it only needs to extend far enough out covering the aperture surface 10 of the light transmissive solid 6 so as to reflect those direct emissions of the solid state light emitters 5 that would otherwise impact the surface 10 at too high or large an angle for total internal reflection. In this way, the combination of total internal reflection in the portion 4 of the surface 10 of the solid 6 together with the reflective mask 9 reflects all or at least substantially all of the direct emissions from the emitters 5, that otherwise would miss the reflector surface 3s, back into the optical integrating volume 2. Stated another way, a person in the area or region illuminated by the fixture 1 would not perceive the LEDs at 5 as visible individual light sources. Instead, all light from the LED type emitters 5 will diffusely reflect one or more times from the surface 3s before emergence through the portion 4 of the emission surface 10 of the solid 6. Since the surface 3s provides diffuse reflectivity, the volume 2 acts as an optical integrating cavity so that the portion 4 of the surface 10 forms an optical aperture providing a substantially uniform output distribution of integrated light (e.g. substantially Lambertian).

Hence, it is possible to utilize the total internal reflection to reduce the size of the mask 9 or otherwise enlarge the effective aperture (size of the optical passage) at 4 through which light emerges from the integrating volume 2. Due to the larger optical aperture or passage, the fixture 1 can actually emit more light with fewer average reflections within the integrating volume 2, improving efficiency of the fixture in comparison to prior fixtures that utilized cavities and apertures that were open to air. It may actually be possible to diffuse the light at the points where the LEDs 5 couple to the transmissive structure 6, e.g. by providing air gaps and/or surface texturing, to eliminate the mask 9 entirely. In this later arrangement, the total internal reflection at surface 10 serves as a virtual mask, to facilitate the desired reflections and optical integration within the volume 2.

In the example, the reflective surface 3s and the combination of the reflective interior surface of the mask 9 and the total internal reflection along at least region 4 of the aperture surface 10 define the boundaries of the optical integrating volume 2. As noted, the solid transmissive structure 6 and the reflector 3 may be shaped so that the optical integrating cavity formed by the optical volume 2 may have any one of a variety of different shapes. For purposes of the discussion of the first example, however, the resulting optical integrating volume 2 is assumed to be hemispherical and the aperture 4 is circular.

The effective optical aperture at 4 forms a virtual source of the light from lighting apparatus or fixture 1. Essentially, electromagnetic energy, typically in the form of light energy from the one or more solid state emitters 5, is diffusely reflected and integrated within the volume 2 as outlined above. This integration forms combined light for a virtual source at the output of the volume, that is to say at the effective optical aperture at 4. The integration, for example, may combine light from multiple sources or spread light from one small source across the broader area of the effective aperture at 4. The integration tends to form a relatively Lambertian distribution across the virtual source. When the fixture illumination is viewed from the area illuminated by the combined light, the virtual source at 4 appears to have substantially infinite depth of the integrated light. Also, the visible intensity is spread uniformly across the virtual source, as opposed to one or more individual small point sources of higher intensity as would be seen if the one or more solid state sources were directly observable without sufficient diffuse processing before emission through an aperture.

Pixelation and color striation are problems with many prior solid state lighting devices. When a non-cavity type LED fixture output is observed, the light output from individual LEDs or the like appear as identifiable/individual point sources or 'pixels.' Even with diffusers or other forms of common mixing, the pixels of the sources are apparent. The observable output of such a prior system exhibits a high maximum-to-minimum intensity ratio. In systems using multiple light color sources, e.g. RGB LEDs, unless observed from a substantial distance from the fixture, the light from the fixture often exhibits striations or separation bands of different colors.

In systems and light fixtures as disclosed herein, however, optical integrating volume 2 converts the point source output(s) of the one or more solid state light emitting elements 5 to a virtual source output of light, at the effective optical aperture formed at region 4, which is free of pixilation or striations. The virtual source output is unpixelated and relatively uniform across the apparent output area of the fixture, e.g. across the portion 4 of the aperture surface 10 of the solid transmissive structure 6 in this first example (FIG. 4). The optical integration sufficiently mixes the light from the solid state light emitting elements 5 that the combined light output of the virtual source is at least substantially Lambertian in distribution across the optical output area of the cavity, that is to say across the effective optical aperture at 4. As a result, the light output exhibits a relatively low maximum-to-minimum intensity ratio across that region 4. In virtual source examples discussed herein, the virtual source light output exhibits a maximum-to-minimum ratio of 2 to 1 or less over substantially the entire optical output area. The area of the virtual source is at least one order of magnitude larger than the area of the point source output(s) of the solid state light emitter(s) 5.

In this way, the diffuse optical processing may convert a single small area (point) source of light from a solid state emitter 5 to a broader area virtual source at the region 4. The diffuse optical processing can also combine a number of such point source outputs to form one virtual source at the region 4.

The optical aperture 4 at the surface 10 of the solid type light transmissive structure 6 may serve as the light output if the fixture 1, directing optically integrated light of relatively uniform intensity distribution to a desired area or region to be illuminated in accord with a particular general lighting application of the fixture. In such an arrangement, the fixture may include a trim ring or the like (not shown) covering some or all of the exposed components shown in FIG. 4 (but not the aperture 4).

It is also contemplated that the fixture 1 may include one or more additional processing elements coupled to the effective optical aperture 4, such as a colliminator, a grate, lens or diffuser (e.g. a holographic element). In some examples, the fixture 1 may include a further optical processing element in the form of a deflector or concentrator coupled to the optical aperture 4, to distribute and/or limit the light output to a desired field of illumination. For further discussion of various types of additional optical processing elements or 'secondary optics' that may be used at or coupled to the aperture, attention may be directed to U.S. Patent Application Publications 2007/0138978, 2007/0051883 and 2007/0045524, for example.

As noted earlier, the drawings presented here as FIGS. 1 to 4 are somewhat stylized representations of a light fixture 1 utilizing a solid light transmissive structure 6, a flexible circuit board 11 and a heat sink member 13, which are useful in illustrating and teaching the technologies under consideration here. FIGS. 5 to 18 are various views of an actual fixture and components thereof implemented in accord with such teachings, and like reference numerals indicate substantially the same elements of that fixture as indicated in FIGS. 1 to 4 and discussed above. In view of these similarities, detailed discussion of the fixture of FIGS. 5 to 18 is omitted here. However, it may be helpful to consider a few supplemental points regarding the later fixture implementation illustrated by FIGS. 5 to 18.

Figures 11, 12:
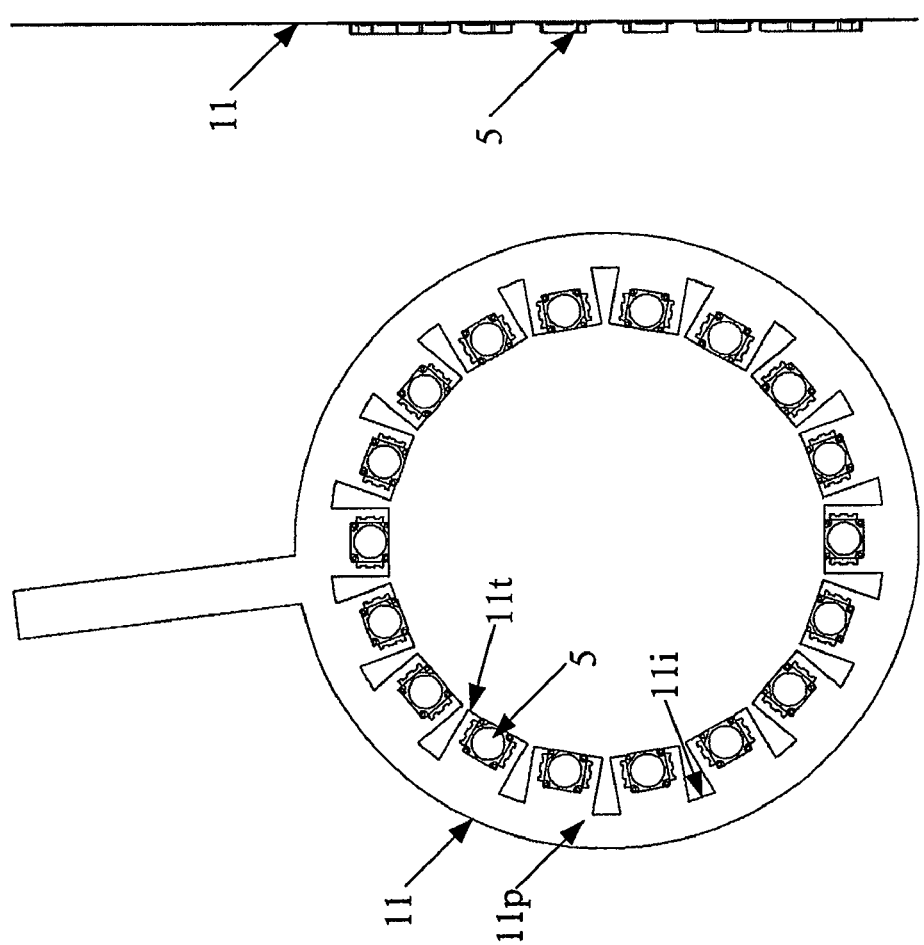
FIG. 11 is a plan view of the flexible circuit board used in the LED type light fixture of FIG. 5.
FIG. 12 is a side view of the flexible circuit board of FIG. 11.
Figure 14:
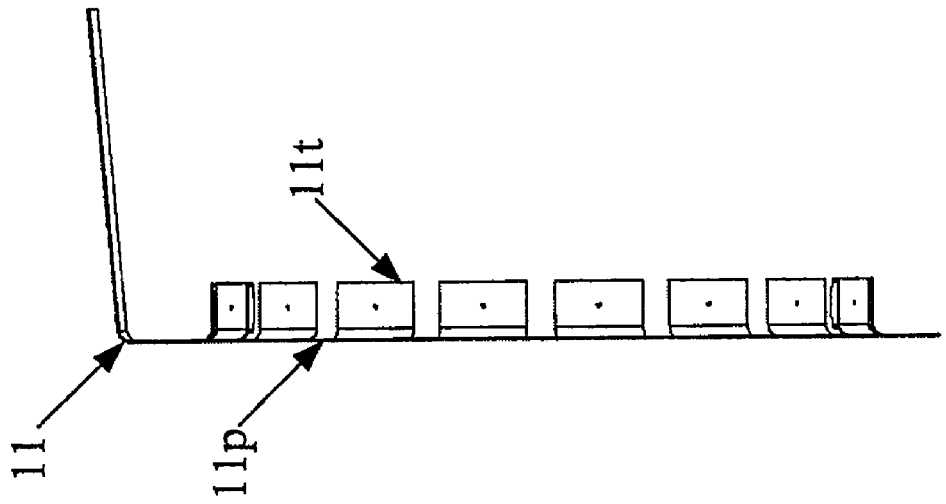
FIG. 14 is a side view of the flexible circuit board, but showing how flexible elements of the board are bent or curved as if installed in the LED type light fixture of FIG. 5.
Figure 13:
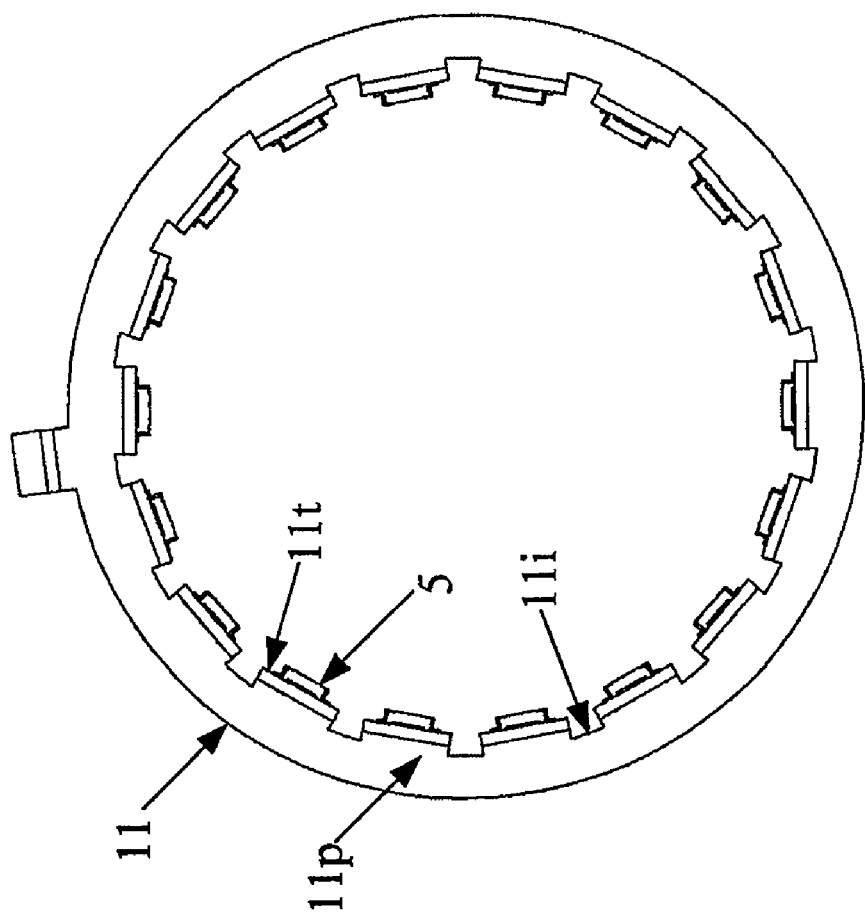
FIG. 13 is a plan view of the flexible circuit board, but showing how flexible elements of the board are bent or curved as if installed in the LED type light fixture of FIG. 5.

For example, FIG. 11 is a plan view and FIG. 12 is a side view of the flexible circuit board 11, with LEDs 5 attached to the tabs 11*t*. In this example, there are 18 tabs and 18 LEDs. Before assembly, as shown in these two drawings, the tabs 11*t* are in a flat state, substantially co-planar with each other and with the rest of the flexible circuit board 11. FIG. 13 is a plan view and FIG. 14 is a side view of the flexible circuit board 11, in a state in which the tabs 11*t* are bent as if the board were installed around the light transmissive structure (although the structure is omitted here for ease of illustration).

A fixture of the type outlined above will typically form part of a lighting system, which includes circuitry for driving the solid state light emitters to generate light (an example of which is discussed later with regard to FIG. 35). In the example of FIGS. 5 to 18, the flexible circuit board 11 includes a strip extending away from the mounting section 11*p* of the flexible circuit board (see e.g. FIGS. 11 and 12). The strip provides the electrical connections to other elements of the circuitry. In such an implementation, the heat sink member 13 may include a passage, for example in an extension of the member 13, as shown in drawing figures such as FIGS. 15 and 18. The strip of the flexible circuit board can be bent with respect to the mounting section of the flexible circuit board (see e.g. FIGS. 13 and 14), to enable the strip to pass through the passage of the heat sink member (see e.g. FIGS. 6 and 8) to connect to the circuitry.

The present discussion encompasses a variety of different structural configurations for the light transmissive structure. In the examples shown and described above, the light transmissive structure comprises a single light transmissive solid 6 substantially filling the volume that forms the optical cavity. A variety of other arrangements or configurations may be used to construct the light transmissive structure. As noted earlier, for example, materials containing phosphors may be provided within or around the solid. It may be helpful to consider an example or two.

FIG. 19 is a cross-sectional view of an alternative construction of the light transmissive structure, here identified by number 6'. The light transmissive structure 6' is formed of two pieces 61 and 62, of light transmissive solid material. The material should be highly transmissive and exhibit low absorption with respect to the relevant light wavelengths, as discussed with regard to the example of FIGS. 1 to 4. Although other materials could be used, in this example, the two pieces 61 and 62 of the light transmissive structure 6' are formed of an appropriate glass. External properties of the structure 6' will be similar to those of the structure 6 in the earlier examples. For example, the contoured surface 6*c*, at least in regions where there is no contact to a solid state light emitter, may have a roughened or etched texture.

Opposing surfaces of the two pieces 61 and 62 of the light transmissive structure 6' are contoured, to mate with each other around the periphery of the junction between the pieces but form a gap 63 between the two surfaces. The two pieces 61 and 62 of the light transmissive structure 6' may be shaped to provide the gap 63 at various locations and/or to have various shapes. For discussion purposes, the drawing shows the gap substantially parallel to the aperture surface 10 at a level spaced from that surface 10, and extending across a substantial portion but not all of the hemispherical structure at that level. The gap 63 contains a phosphor or phosphor bearing material. There may be some additional space in the gap, but in the exemplary structure 6', the phosphor bearing material at least substantially fills the volume of the gap 63.

In an example utilizing a phosphor, it is desirable to encapsulate the phosphor material in a manner that blocks out oxygen. Hence, in the example of FIG. 19, the two solid pieces or sections 61, 62 of the light transmissive structure 6' are both glass. As in the earlier example, the glass used is at least a BK7 grade or optical quality of glass, or equivalent. It is desirable for the solid, in this case the glass, to have a high transmissivity with respect to light of the relevant wavelengths processed within the cavity 2 and/or a low level of light absorption with respect to light of such wavelengths. Various sealing arrangements may be provided around the edges of the chamber formed by the gap 63, to maintain a good oxygen barrier to shield the phosphors from oxygen, which degrades the phosphors reducing the useful life of the phosphors.

A variety of conventional phosphors may be used. Recently developed quantum dot (Q-dot) phosphors or doped quantum dot (D-dot) phosphors may be used. Phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. Quantum dots (Q-dots) provide similar shifts in wavelengths of light. Quantum dots are nano scale semiconductor particles, typically crystalline in nature, which absorb light of one wavelength and re-emit light at a different wavelength, much like conventional phosphors. However, unlike conventional phosphors, optical properties of the quantum dots can be more easily tailored, for example, as a function of the size of the dots. In this way, for example, it is possible to adjust the absorption spectrum and/or the emission spectrum of the quantum dots by controlling crystal formation during the manufacturing process so as to change the size of the quantum dots. Thus, quantum dots of the same material, but with different sizes, can absorb and/or emit light of different colors. For at least some exemplary quantum dot materials, the larger the dots, the redder the spectrum of re-emitted light; whereas smaller dots produce a bluer spectrum of re-emitted light. Doped quantum dot (D-dot) phosphors are similar to quantum dots but are also doped in a manner similar to doping of a semiconductor.

The phosphors may be provided in the gap 63 in the form of an ink or paint applied to one or both of the mating surfaces of the pieces 61 and 62. However, in the example of FIG. 19, the phosphors in the gap 63 are carried in a binder or other medium. The medium preferably is highly transparent (high transmissivity and/or low absorption to light of the relevant wavelengths). Although alcohol, vegetable oil or other media may be used, in the example of FIG. 19, the medium may be a silicon material. If silicone is used, it may be in gel form or cured into a hardened form in the finished light fixture product. An example of a suitable material, having D-dot type phosphors in a silicone medium, is available from NN Labs of Fayetteville, Ark. A Q-Dot product, applicable as an ink or paint, is available from QD Vision of Watertown Mass.

As noted, the present discussion encompasses a variety of different structural configurations for the light transmissive structure. As another approach (FIG. 20), instead of using a solid structure (e.g. FIG. 1) or solid structure with a gap or chamber for a phosphor (FIG. 19), the light transmissive structure may comprise a container. Although the container could be filled with a gas, in the illustrated example, the container is filled with a liquid. The liquid may contain a phosphor, such as one or more of the Q-dot or D-dot phosphors mentioned above. FIG. 20 is an example of a light transmissive structure 6" constructed in such a manner.

As shown in FIG. 20, the light transmissive structure 6" includes a container. Although other container structures may be used, for ease of illustration, the exemplary container is formed of a plate 64 and a hemispherical dome 65. As in the solid examples, these elements should exhibit high transmissivity and low absorption with respect to light of the relevant wavelengths. Although other materials could be used, to provide good containment and an excellent oxygen barrier, the example of FIG. 20 uses glass for the plate 64 and the dome 65.

In the example of FIG. 20, the container formed by the plate 64 and the dome 65 is filled with a liquid 66. The liquid could be transparent or translucent, with no active optical properties. However, for discussion purposes, the liquid 66 contains phosphor materials, such as Q-dot or D-dot quantum type nano phosphors. Those skilled in the art will recognize that there are various ways to join the components of the container, such as 64 and 65, together to form a liquid tight and air tight seal, and that there are various ways to fill the container with the desired liquid in a manner that eliminates at least substantially all oxygen bearing gases. In the illustrated example, the liquid 66 substantially fills the volume of the container formed by the elements 64 and 65, with little or no gas entrained in the liquid 66.

The phosphors contained in the gap 63 or in the liquid 66 will be selected to facilitate a particular lighting application for the particular fixture. That is to say, for a given spectrum of light produced by the LEDs (L) and the diffusely reflective optical cavity, the material and/or sizing of the nano phosphors or other phosphors will be such as to shift at least some of the light emerging through the aperture in a desired manner.

Nano phosphors are often produced in solution. Near the final production stage, the nano phosphors are contained in a liquid solvent. In a nano phosphor example, this liquid solution could be used as the solution 66 in the example of FIG. 20. However, the solvents tend to be rather volatile/flammable, and other liquids such as water or vegetable oil may be used. The phosphors may be contained in a dissolved state in solution, or the liquid and phosphors may form an emulsion. The liquid itself may be transparent, or the liquid may have a scattering or diffusing effect of its own (caused by an additional scattering agent in the liquid or by the translucent nature of the particular liquid).

The container formed by the plate 64 and the dome 65, together with the liquid 66, substantially fill the optical volume 2, of the light fixture that incorporates the structure 6". External properties of the structure 6" will be similar to those of the structure 6 in the earlier examples. For example, the contoured surface 6c, at least in regions where there is no contact to a solid state light emitter, may have a roughened or etched texture.

FIG. 21 is a cross-sectional view of yet another alternative construction of the light transmissive structure, here identified by number 6', which incorporates a phosphor or phosphor bearing material 69. For example, the structure may utilize two pieces of the light transmissive solid with a gap therebetween, filled with the phosphor or phosphor bearing material, similar to the structure of FIG. 19. However, rather than positioning the phosphor somewhat near the middle of the volume of the light transmissive structure as in FIG. 19, the arrangement of FIG. 21 locates the phosphor near or at the optical aperture surface of the light transmissive structure.

In the example of FIG. 21, the light transmissive structure 6''' comprises a main section 67, which is essentially similar to the solid 6 the example of FIG. 1. However, the light transmissive structure 6''' also includes a section 68 containing the phosphor and forming the aperture surface 10. The section 68 may be constructed in a number of different ways, two examples of which are represented by the enlarged detail sections (corresponding approximately to the region encircled at B-B in FIG. 21) of FIGS. 21A and 21B.

For example, the pieces of the light transmissive solid with a gap therebetween may consist of the main section 67 and an additional light transmissive member 681 (FIG. 21A). In such an arrangement, the phosphor containment section 68a includes the member 681 and the gap formed between that member and the face of the main section 67. The gap is filled with a phosphor or phosphor bearing material, such as discussed above relative to the example of FIG. 19. The member

681 is attached to the section 67 in a manner to provide an air tight seal. In such an arrangement, the main section 67 and the light transmissive member 681 would typically be formed of glass, to insure that no air reaches the phosphor contained in the gap.

In the other example (FIG. 21B), the phosphor containment section 68b includes two pieces of the light transmissive solid members 682 and 683 with a gap therebetween, filled with a phosphor or phosphor bearing material 69. In this arrangement, the solid element 682 is attached to or positioned against/adjacent to the face of the main section 67. The two light transmissive solid members 682 and 683 typically would be glass and would be sealed to contain the phosphor in an air tight manner. However, with this arrangement, it may be feasible to use a different light transmissive material for the main section 67, as that section need not be impervious to gas leakage.

As in the earlier examples, it may be desirable to provide a roughened or etched texture at the optical aperture, for example, on the surface 10 of the appropriate element or section in any of the examples of FIGS. 19-21. In the versions using a phosphor, the texture at the aperture may help to obscure the non-white coloration of the phosphor bearing material when the light fixture is not turned ON.

Figure 22:
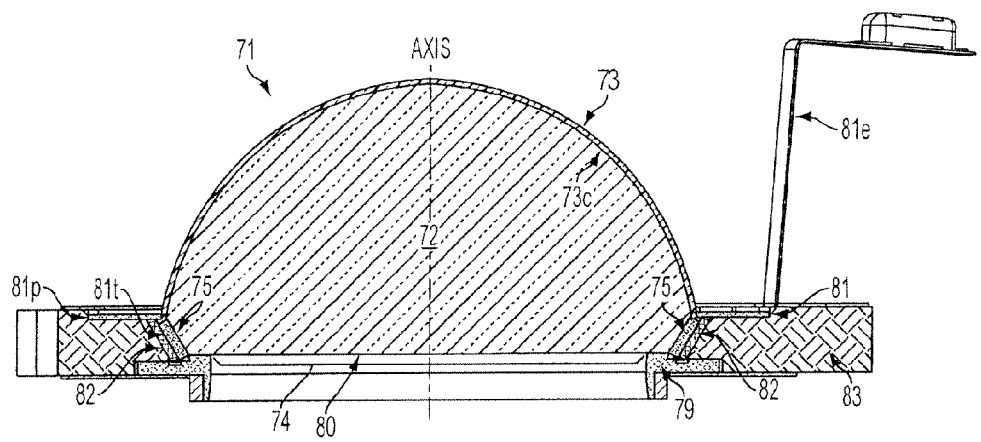
FIG. 22 is a cross-sectional view of another example of an LED type light engine or fixture, having a solid-filled optical integrating cavity.
Figure 23:
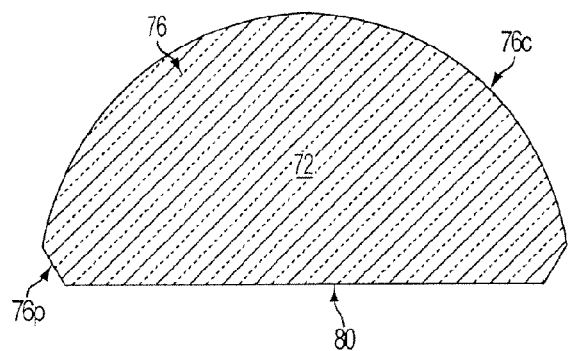
FIG. 23 is a cross-sectional view of a one-piece solid construction of the light transmissive structure, used in the fixture of FIG. 22.
Figure 24:
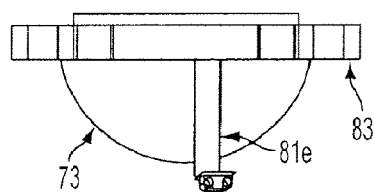
FIGS. 24 to 29 are various other views of the LED type light fixture of FIG. 22.
Figure 25:
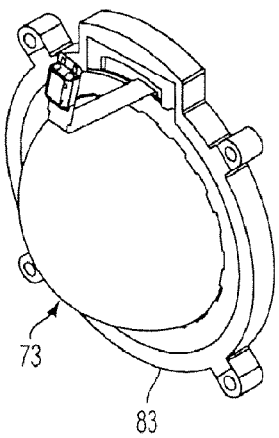
Figure 26:
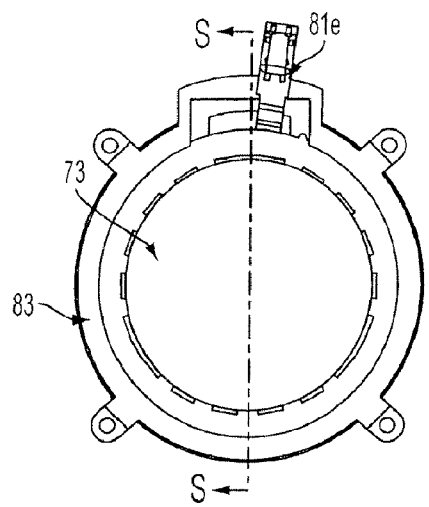
Figure 27:
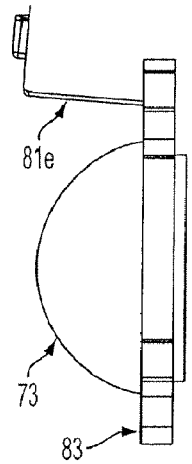
Figure 28:
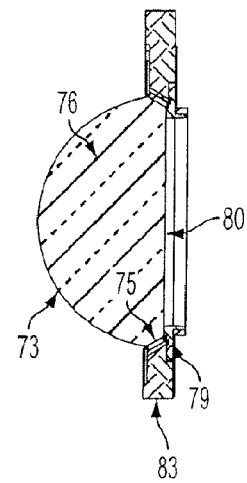
Figure 29:
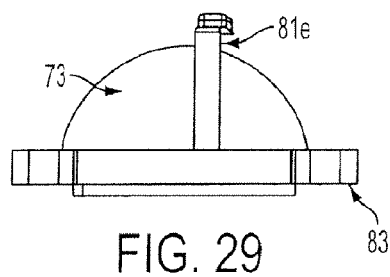

FIG. 22 is a cross-section of another example of a light fixture or engine 71 intended for general lighting, for example, in a region or area intended to be occupied by a person. FIG. 23 is a cross-sectional view of a one-piece solid construction of the light transmissive structure 76 that forms the optical volume 72, in the fixture or engine 71 of FIG. 22. FIGS. 24-29 provide other views of the fixture or engine 71. These and other drawings of this example are not drawn to scale. In several of the illustrations, such as FIGS. 22 and 29, for convenience, the lighting apparatus is shown in an orientation for emitting light downward. However, the apparatus 71 may be oriented in any desired direction to perform a desired general lighting application function.

Figure 34:
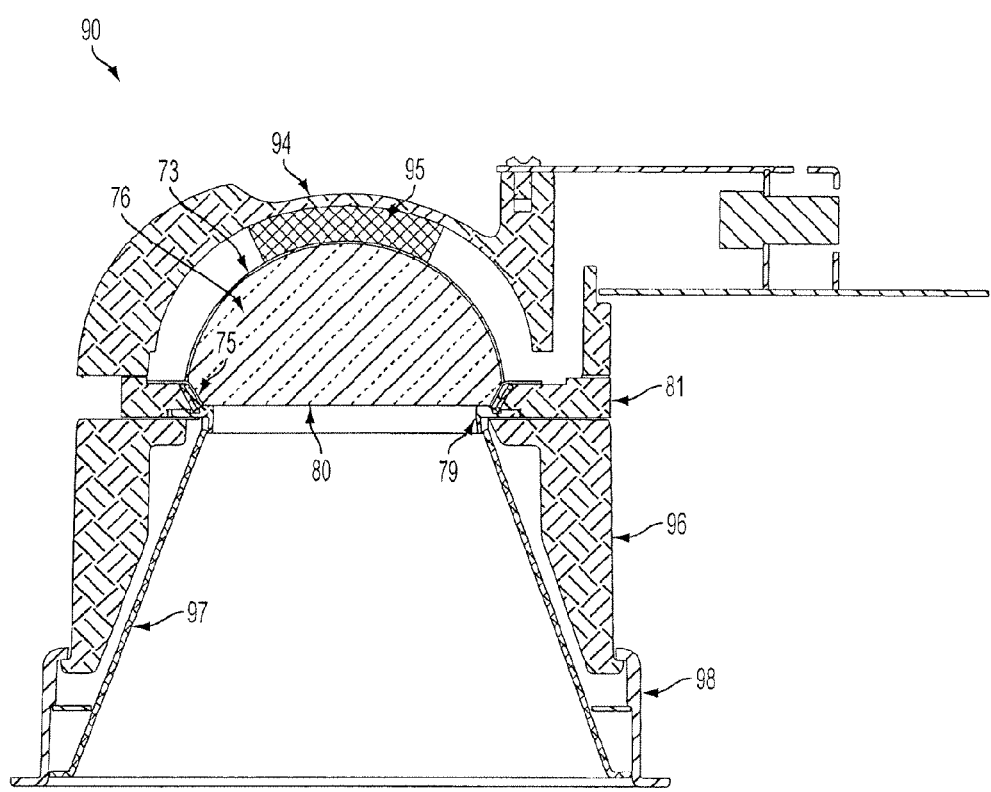
FIG. 34 a cross-sectional view of a light incorporating the engine or fixture of FIG. 22 with housing components and a secondary optic, in this case, a reflector coupled to the aperture.

The apparatus 71 could be used alone to form a light fixture or more likely would be used with other housing elements and possibly with a secondary optic (e.g. such as shown in FIG. 34) to form the overall commercial light fixture product. Together with the other electrical components (e.g. as in FIG. 35), the apparatus or "light engine" 71 of FIG. 22 or the fixture of FIG. 35 would form a lighting system.

The exemplary fixture or engine 71 includes a plurality of LED type solid state light emitters 75 and a light transmissive structure 76 forming a volume 72. As in the earlier examples, the emitters 75 are sufficient in number and strength of output for the light engine 71 to produce light intensity sufficient for the general lighting application of the fixture.

As shown in FIG. 23, the light transmissive structure 76 has a contoured outer surface 76c and an optical aperture surface 80. In this example, the surface 76c corresponds to a segment of a sphere somewhat less than a hemisphere and does not extend continuously to the periphery of the aperture surface 80 as in the earlier examples. In this example, the light transmissive structure 76 also has a peripheral optical coupling surface 76p between the contoured outer surface 76c and the optical aperture surface 80. In this example, the peripheral optical coupling surface 76p forms an obtuse angle with respect to the optical aperture surface 80 (and an acute angle with respect to the vertical in the downlight orientation of FIG. 22). At least the outer peripheral portion 76p of the structure 76 along the lower portion of contoured surface 76c is substantially rigid.

In this example, the contoured surface 76c has a roughened or etched texture, and some or all of the aperture surface 80 may have a roughened or etched texture. In such an implementation, at least any portion of the angled peripheral optical coupling surface 76p of the light transmissive structure 76 that receives light from one of the solid state light emitters 75 likely would be highly transparent. Of course, the aperture surface 80 may be highly transparent as well. In the example, the aperture surface 80 is shown as a flat surface. However, those skilled in the art will recognize that this surface 80 may have a convex or concave contour.

In the example of FIGS. 22-29, the outer surfaces of the structure 76 approach or approximate a hemisphere that is somewhat truncated at the peripheral region by the angled surface 76p. Again, the optical aperture surface now identified by number 80 approximates a circle. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the light transmissive structure, and thus the optical cavity 72 of the fixture or light engine 71, may have any shape providing adequate reflections within the volume/cavity for a particular application. For example, the contour of the upper surface 76c may be hemispherical, may correspond in cross section to a segment of a circle less than a half circle (less than hemispherical), or may extend somewhat further than a hemisphere to correspond in cross section to a segment of a circle larger than a half circle. Also, the contoured portion 76c may be somewhat flattened or somewhat elongated relative to the illustrated axis of the aperture 74, the aperture surface 80 and the exemplary solid 76 (in the vertical direction in the exemplary downlight orientation depicted in FIG. 22). The coupling surface 76p is shown having a substantially flat cross-section, although of course it would curve around the circular structure 76. However, other shapes or contours for the surface 76p may be used, for example, with a convex cross section or concave cross-section or with indentations to receive emitting surfaces or elements of particular types of LEDs 75.

In a manner similar to the examples of FIGS. 1-10, in the example of FIGS. 22 and 23 the light transmissive structure forming the volume 72 comprises a one piece light transmissive solid 76 substantially filling the volume 72. Materials containing phosphors may be provided within or around the solid, as discussed earlier, although for simplicity, phosphors and containment thereof are omitted from the example shown in FIGS. 22 and 23. The solid 76 is a single integral piece of light transmissive material. The material, for example, may be a highly transmissve and/or low absorption acrylic having the desired shape. In this example, the light transmissive solid structure 76 is formed of an appropriate glass, such as a fused silica type glass of at least a BK7 grade or equivalent optical quality. For optical efficiency, it is desirable for the solid structure 76, in this case the glass, to have a high transmissivity with respect to light of the relevant wavelengths processed within the optical cavity 72 and/or a low level of light absorption with respect to light of such wavelengths. For example, in an implementation using BK7 or better optical quality of glass, the highly transmissive glass exhibits 0.99 internal transmittance or better (BK7 exhibits a 0.992 internal transmittance).

The fixture or light engine 71 also includes a reflector 73, which has a diffusely reflective interior surface 73s extending over at least a substantial portion of the outer surface of the light transmissive structure 76, in this case over the contoured outer surface 76c although it could extend over some portion or portions of the angled coupling surface 76p not expected to receive light input from the emitters 75. The surface 76c is roughened for example by etching. For optical efficiency, however, the surface texture should provide only a minimal air gap between the diffusely reflective interior surface 73s of the reflector 73 and the corresponding portion(s) of the contoured outer surface 76c of the light transmissive structure 76. The diffuse reflective surface 73s forms an optical cavity from and/or encompassing the volume 72 of the light transmissive structure 76, with an optical aperture 74 formed from a portion or all of the aperture surface 80 of the light transmissive structure 76.

It is desirable that the diffusely reflective surface(s) 73s of the reflector 73 have a highly efficient reflective characteristic, e.g. a reflectivity equal to or greater than 90%, with respect to the relevant wavelengths. Diffuse white materials exhibiting 98% or greater reflectivity are available. Although other materials may be used, including some discussed above relative to earlier examples, the illustrated example of FIG. 22 uses WhiteOptics™. The WhiteOptics™ reflector 73 is approximately 97% reflective with respect to the visible white light from the LED type solid state emitters 75. In the example, the entire inner surface 73s of the reflector 73 is diffusely reflective, although those skilled in the art will appreciated that one or more substantial portions may be diffusely reflective while other portion(s) of the surface 73s may have different light reflective characteristics, such as a specular or semi-specular characteristic.

At least a portion of the aperture surface 80 of the light transmissive structure 76 serves as a transmissive optical passage or effective "optical aperture" 74 for emission of integrated light, from the optical integrating volume 72, in a direction to facilitate the particular general lighting application in the region or area to be illuminated by the light fixture (generally downward and/or outward from the fixture in the orientation of FIG. 22). The entire surface 80 of the solid structure 76 could provide light emission. However, the example of FIG. 22 includes a mask 79 having a reflective surface facing into the optical integrating volume 72, which somewhat reduces the surface area forming the transmissive passage to that portion of the surface shown at 74. The optical volume 72 operates as an optical integrating cavity (albeit one filled with the light transmissive solid of structure 76), and the passage 74 for light emission forms the optical aperture of that cavity.

As noted, the surface of the mask 79 that faces into the optical integrating volume 72 (faces upward in the illustrated orientation) is reflective. That surface may be diffusely reflective, much like the surface 73s, or that mask surface may be specular, quasi specular or semi-specular. Other surfaces of the mask 79 may or may not be reflective, and if reflective, may exhibit the same or different types/qualities of reflectivity than the surface of the mask 79 that faces into the optical integrating volume 72. In one configuration, the surface of the mask 79 that faces into the optical integrating volume 72 might be diffusely reflective (having reflective properties similar to those of reflective surface 73s), whereas the surface of the mask facing inward/across the aperture 74 might be specular. Specular reflectivity across the aperture reduces reflection back through the aperture into the integrating volume due to diffuse reflection that might otherwise occur if that portion of the mask exhibited a diffuse reflectivity.

In the example, the light fixture 71 also includes one or more solid state light emitters 75. An emitter 75 may be any appropriate type of light emitting semiconductor based device. In the specific examples discussed herein the solid state light emitters are light emitting diodes (LEDs). The present teachings encompass use of various types/colors of LEDs, such as red (R), green (G) and blue (B) LEDs, ultraviolet (LEDs) to pump phosphors in the fixture, LEDs of two or more different color temperatures of white light, etc. Various combinations of different colors of LEDs may be used. However, for simplicity, the discussion of this example will assume that the LED type solid state light emitters 75 are white light LEDs rated to all emit the same color temperature of white light. Hence, in the illustrated example of the circuitry (FIG. 35 as discussed, later), each LED is a white LED of the same or similar model. As noted, there may be as few as one solid state emitter, however, for illustration and discussion purposes, we will assume in most instances below that the fixture includes a plurality of solid state emitters. The number and output capabilities of the solid state light emitters 75 are such that the combined white light output via the aperture 74 provides light intensity sufficient for a particular general lighting application intended for the light fixture 71. An actual downlight implementations, for example, might include fifteen white LEDs as the solid state light emitters 75.

As discussed more below, the light emitters 75 are held against the angled peripheral optical coupling surface 76p, to supply light through that surface into the interior volume 72 formed by the light transmissible structure 76. There may be some minimal air gap between the emitter output and the optical coupling surface 76p. However, to improve out-coupling of light from the emitters 75 into the light transmissive solid structure 76, it may be helpful to provide an optical grease, glue or gel between the peripheral optical coupling surface 76p and the output of each solid state light emitter 75. This material eliminates any air gap and provides refractive index matching relative to the material of the relevant portion of the light transmissive structure 76, for example, the material forming the angled peripheral optical coupling surface 76p.

The exemplary light fixture or engine 71 also includes a flexible circuit board 81. In a manner similar to the earlier examples in FIGS. 3 and 11-14, the flexible circuit board 81 has a mounting section or region 81p that typically will be at least substantially planar (and is therefore referred to herein as a "planar" mounting section) for convenience in this example. The planar mounting section 81p of the flexible circuit board 81 has an inner peripheral portion 11i. In this example, the lateral shape of the solid forming the light transmissive structure 76 is circular (see e.g. top view in FIG. 26). The inner peripheral portion of the flexible circuit board 81 has a shape substantially similar shape, that is to say a circular shape in the example. The circular inner peripheral portion of the flexible circuit board 81 has a size slightly larger than the circular outer peripheral portion at the edge between the surfaces 76c and 76p of the light transmissive structure 76. The flexible circuit board includes a strip 81e, extending away from the planar mounting section, for providing electrical connection(s) to the driver circuitry.

The flexible circuit board 81 also has flexible tabs 81t attached to and extending from the inner peripheral region of the flexible circuit board 81. As noted earlier, the number and type of LED type solid state light emitters 75 used in the fixture 71 are selected so as to produce light intensity sufficient for a general lighting application of the fixture 71. The emitters 75 are mounted on the tabs 81t. At least one of the solid state light emitters 75 is mounted on a first surface of each of the tabs 81t of the flexible circuit board 81, in this example, although some tabs could be empty or carry other elements such as a light sensor instead of an LED.

Figure 33:
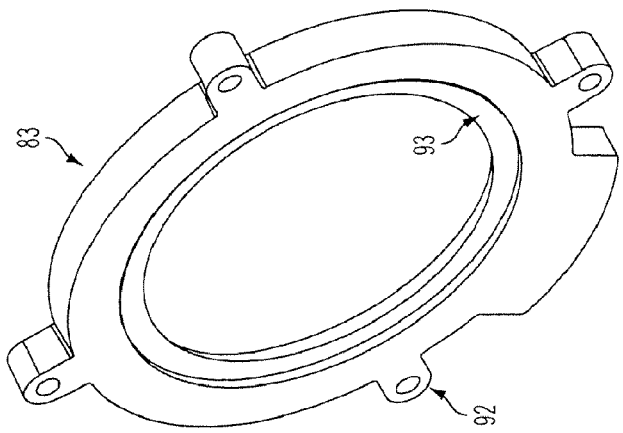
FIG. 33 an isometric view of the bottom of the heat sink ring of FIG. 30.
Figure 32:
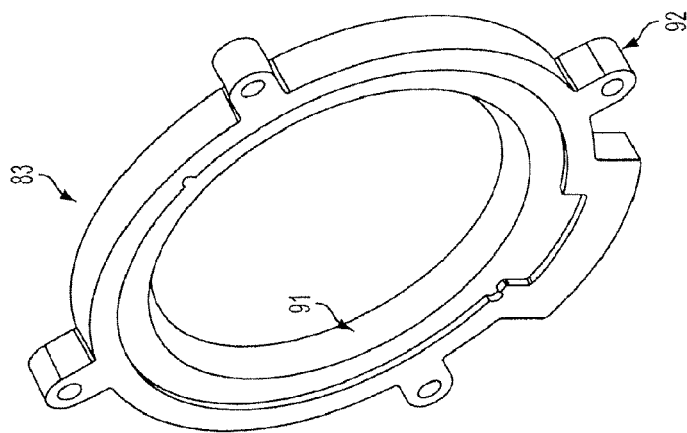
FIG. 32 an isometric view of the top of the heat sink ring of FIG. 30.
Figure 31:
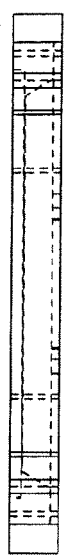
FIG. 31 is a side view of the heat sink ring of FIG. 30.

As in the earlier examples, the fixture 71 also includes a heat sink member 83. The heat sink member 83 is constructed of a material with good heat conduction properties and sufficient strength to support the flexible circuit board and associated LED light emitters, typically a metal such as aluminum. As shown in a later drawing (FIG. 33), cooling fins may be coupled to the heat sink member 83, for example, as part of one or more additional aluminum housing components. More detailed views of the heat sink member or ring 83 are shown in FIGS. 31-33.

Figure 30:
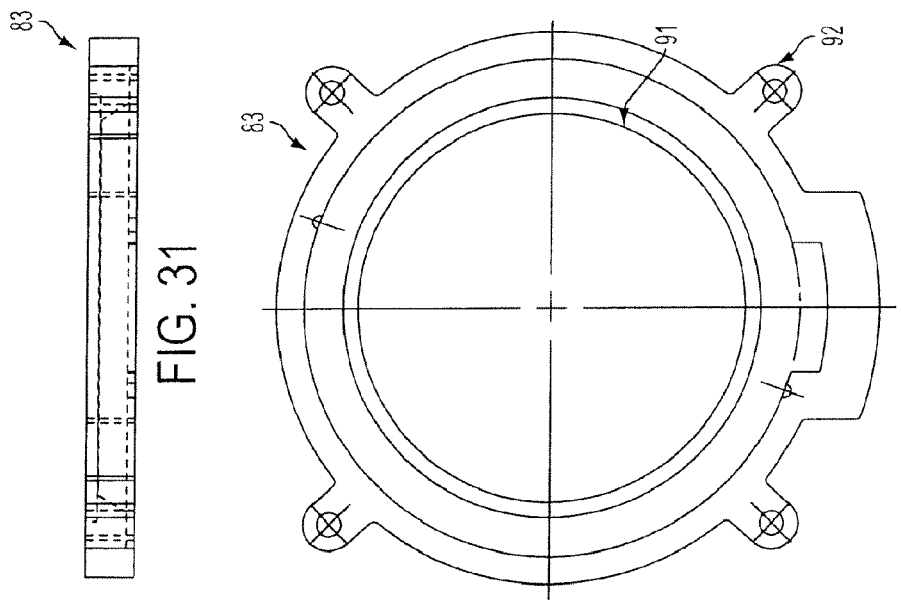
FIG. 30 is a top plan view of the heat sink ring of the LED type light fixture of FIG. 22.

The heat sink member 83 has an inner peripheral portion of substantially similar shape and of a size slightly larger than the outer peripheral portion of the light transmissive structure 76. In this case, the heat sink member 83 has a circular inner peripheral portion but with a surface 91 (FIGS. 30 and 32) at a slant corresponding to the angle of surface 76p. The obtuse angle of the peripheral optical coupling surface 76p with respect to the optical aperture surface 80 of light transmissive structure is approximately 120° (interior angle with respect to the horizontal in the illustrated orientation is 60°, and angle of the surface cross section relative to the vertical in the illustrated orientation is 30°. Hence, although the inner peripheral portion of the heat sink member 83 has a somewhat larger diameter than the outer peripheral portion of the light transmissive structure 76, the inner surface (91 in FIG. 30) of the heat sink member 83 is machined to have an angle of approximately 120° with respect to the optical aperture surface 80 (interior angle with respect to the horizontal in the illustrated orientation of FIG. 22 is 60°, and angle of the surface cross section relative to the vertical in the illustrated orientation of FIG. 22 is 30°.

The ring shaped heat sink member 83 in the example is a single solid member, for example, formed of aluminum. Those skilled in the art will realize that other configurations may be used, as discussed above with regard to other examples. The opposite side of heat sink member 83 (FIG. 33) may have a ring-shaped indentation 93 for mating with the mask 79 (FIG. 22). The exemplary heat sink also includes one or more posts 92 (FIGS. 30-33) extending outward from the main part of the ring. Each post 92 has a screw or bolt hole for passage of a bolt or similar fastener, for use in the assembly of the light engine 71 together with other components.

Returning to FIG. 22, as assembled to form the light fixture or engine 71, the planar mounting section 81p of the flexible circuit board 81 is mounted on an attachment surface of the heat sink member 83 having an inner edge corresponding to junction between angled inner surface and the mounting surface. In the illustrated downlight orientation (FIG. 22), attachment surface of the heat sink member is on the top side of the heat sink member. The mounting section of the flexible circuit board 81 may be attached to the planar attachment surface of the heat sink member 83 by an adhesive or glue or by any other cost-effective means.

The flexible tabs 81t are bent at a substantial angle with respect to the mounting section of the heat sink member 81, around the inner edge of that surface, by pressure of the solid state emitters 75 mounted on the tabs 81t against the outer peripheral coupling surface 76p of the light transmissive structure 76. In the illustrated downlight orientation (FIG. 22), each tab will bend to an angle approximately the same as the angle of the surfaces that it fits between, in this case approximately 120° with respect to the optical aperture surface 80 (interior angle with respect to the horizontal in the illustrated orientation of FIG. 22 is 60°, and angle of the surface cross section relative to the vertical in the illustrated orientation of FIG. 22 is 30°.

The tabs may be constructed in a manner similar to those in the earlier examples. The first surface of a tab 81t supports a solid state light emitter 75 and receives heat from the emitter. The tab 81t is constructed to conduct the heat from the solid state light emitter 75 to its opposite or second surface. The second surface of each respective one of the tabs provides heat transfer to the heat sink member 83, to permit heat transfer from each solid state emitter on each respective tab to the heat sink member.

In the example of FIG. 22, the fixture or light engine 71 also includes thermal interface material (TIM) 82 positioned between the second surface of each tab 81t and a corresponding inner surface of the heat sink member 83. The TIM 82 provides electrical insulation between the tabs 81t and the heat sink member 83, for example, for an implementation in which the heat slug of the emitter 75 is conductive. The TIM 82, however, also provides thermal conductivity to the heat sink member 83. In the examples, pressure created by contact of the solid state light emitters 75 with the angled optical coupling surface 76p along the outer peripheral portion of the light transmissive structure 76 compresses the TIM 82 against the surface of the heat sink member 83.

The positioning of each emitter 75 provides an orientation in which a central axis of emission of the respective light emitter (shown as an arrow from each LED in FIG. 22) is at a substantial angle with respect to the perpendicular axis of the aperture 74 and/or of the aperture surface 80 of the light transmissive structure 76. In the earlier examples, the angle of emission with respect to the aperture axis may be approximately perpendicular (90°). In this example (FIG. 22), however, the coupling surface 76p is at an angle so that the central axis of emission of the respective light emitter 75 is directed somewhat more away from aperture 74 and/or the aperture surface 80 of the light transmissive structure 76. Since, the central axis of emission of the respective light emitter 75 is substantially perpendicular to the coupling surface 76p, and the coupling surface 76p forms an obtuse angle with respect to the aperture surface 80, the central axis of emission of the respective light emitter 75 in this example is at an acute angle away from the aperture surface 80.

Although other angles may be used, the coupling surface 76p in the example forms an angle of approximately 120° with respect to the aperture surface 80, therefore the angle between the central axis of emission of the respective light emitter 75 and the aperture surface 80 in this example is approximately 30°. From another perspective, this results in the central axis of emission of the respective light emitter 75 having approximately a 60° angle with respect to the perpendicular axis of the aperture 74 and/or of the aperture surface 80 of the light transmissive structure 76.

This angle of emission from the emitters 75 reduces even further the amount of the direct emissions that impact the optical aperture surface 80 at a steep angle. At least in the region 74 forming the actual aperture, those direct light emissions that do impact the surface 80 impact at a relatively shallow angle. Somewhat more even than in the earlier examples, the portion 74 of the aperture surface 80 of the light transmissive solid 76 that serves as the optical aperture or passage out of the optical integrating volume 72 exhibits total internal reflection with respect to light reaching that surface directly from the emitters 75, and that total internal reflection reflects direct light emission hitting the surface at a shallow angle back into the optical integrating volume 72. In contrast, light that has been diffusely reflected from regions of the surface 73s of the reflector arriving at larger angles to the surface 80 are not subject to total internal reflection and pass through portion 74 of the aperture surface 80 that forms the optical aperture.

The mask 79 therefore can be relatively small in that it only needs to extend far enough out covering the aperture surface 80 of the light transmissive solid 76 so as to block direct view of the LEDs 75 through the aperture 74 and to reflect those few direct emissions of the solid state light emitters 75 that might otherwise still impact the surface 80 at too high or large an angle for total internal reflection. In this way, the combination of total internal reflection in the portion 74 of the surface 80 of the solid 76 together with the reflective mask 79 reflects all or at least substantially all of the direct emissions from the emitters 75, that otherwise would miss the reflector surface 73s, back into the optical integrating volume 72. Stated another way, a person in the area or region illuminated by the fixture 71 would not perceive the LEDs at 75 as visible individual light sources. Instead, virtually all light input to the volume from the LED type emitters 75 will diffusely reflect one or more times from the surface 73s before emergence through the aperture portion 74 of the surface 80 of the solid 76. Since the surface 73s provides diffuse reflectivity, the volume 72 acts as an optical integrating cavity so that the portion 74 of the surface 80 forms an optical aperture providing a substantially uniform output distribution of integrated light (e.g. substantially Lambertian).

As in the earlier examples, it is possible to utilize the total internal reflection to reduce the size of the mask 79 or otherwise enlarge the effective aperture (size of the optical passage) at 74 through which light emerges from the integrating volume 72. Due to the larger optical aperture or passage, the fixture 71 can actually emit more light with fewer average reflections within the integrating volume 72, improving efficiency of the fixture in comparison to prior fixtures that utilized cavities and apertures that were open to air.

The effective optical aperture at 74 forms a virtual source of the light from lighting apparatus or fixture 71, which exhibits a relatively Lambertian distribution across the virtual source, as in the earlier examples. When the fixture illumination is viewed from the area illuminated by the combined light, the virtual source at 74 appears to have substantially infinite depth of the integrated light. Also, the visible intensity is spread uniformly across the virtual source, as opposed to one or more individual small point sources of higher intensity as would be seen if the one or more solid state sources were directly observable without sufficient diffuse processing before emission through an aperture. Again, the optical integration in the volume 72 reduces or eliminates pixelation and color striation in the light output via the aperture 74. The light output exhibits a relatively low maximum-to-minimum intensity ratio across that region 74. In virtual source examples discussed herein, the virtual source light output exhibits a maximum to minimum ratio of 2 to 1 or less over substantially the entire optical output area. The area of the virtual source is at least one order of magnitude larger than the area of the point source output(s) of the solid state light emitter(s) 75. In this way, the diffuse optical processing may convert a single small area (point) source of light from a solid state emitter 75 to a broader area virtual source at the region 74. The diffuse optical processing can also combine a number of such point source outputs to form one virtual source at the region 74.

As discussed earlier, the optical aperture 74 at the surface 80 of the solid type light transmissive structure 76 may serve as the light output if the fixture 71, directing optically integrated light of relatively uniform intensity distribution to a desired area or region to be illuminated in accord with a particular general lighting application of the fixture. In such an arrangement, the fixture may include a trim ring or the like (not shown) covering some or all of the exposed components (but not the aperture 74).

However, the light engine example 71 of FIG. 22 is intended for use with other elements to form a commercial fixture. As shown in cross-section in FIG. 34, the commercial fixture product 90 includes the elements of the light engine, including the reflector 73, emitters 75, light transmissive structure 76 (with aperture surface 80), mask 79, heat sink ring 81, etc. The fixture 90 also includes an upper housing or cover 94 and a lower housing 96. The upper housing 94 encloses the reflector 73 and the solid light transmissive structure 76 although it is somewhat larger than the reflector 73 and the solid light transmissive structure 76 so that there is some space between the reflector and the inner curved surface of the upper housing 94.

The fixture 90 also includes a flexible compressible pad 95, between the inner surface of the upper housing 94 and the outer surface of the reflector 73. Although other attachment mechanisms may be used, in this example, the upper housing 94 is bolted to a lower hosing 96. The bolts extend through holes in posts 92 formed in the heat sink ring 81 (see e.g. FIGS. 30-33). In this way, the heat sink ring 81 is sandwiched between opposed surfaces of the housing members 94, 96 (FIG. 34). The inner surface of the upper housing 94 and the pad 95 are sized so that the assembly of the housings and the heat sink ring compresses the pad 95 between the inner surface of the upper housing 94 and the outer surface of the reflector 73. This applies pressure through the reflector 73 to the solid light transmissive structure 76, to hold the structure 76 as well as the LEDs 75, the tabs of the flexible circuit board and the TIM against the angled surface of the heat sink ring 81, as shown for example in FIGS. 22 and 34. The aperture surface 80 also abuts the white reflective surface of the mask 79. The use of the angled shapes also tends to align the various components of the light engine (71 in FIG. 22) in the desired manner, for example, without tilt of the structure 76 or surface 80 relative to the mask 79.

The housing elements 94, 96, like the heat sink ring 81, are formed of a good heat conductive material. In the example, the housings 94, 96 may be cast aluminum elements. Outer portions of one or preferably both housings 94, 96 incorporate fins Heat from the emitters 75 is transferred to the heat sink ring 81, as discussed earlier. From the ring 81, the heat travels to the housings 94, 96 where it may be dissipated to the surrounding atmosphere via the fins. To promote heat transfer from the heat sink member or ring 81 to the housings, the fixture may include adhesive TIM layers on the appropriate surfaces of the heat sink ring 81 (see FIG. 22).

The fixture 90 illustrated in FIG. 34 also includes a secondary optic. Although other secondary optics may be used, in this example the secondary optic includes a deflector or concentrator 97 having a reflective inner surface. The surface may have different reflective characteristics. For example specular, semi-specular and diffuse reflectivities and/or combinations thereof are contemplated. As noted above, the surface of the mask 79 that faces into the optical integrating volume 72 (faces upward in the orientation illustrated in FIGS. 22 and 34) may be diffusely reflective. The mask includes a boss formed to extend away from the aperture surface 80. The inner surface of this boss or extension faces across the aperture opening through the mask 79 and might be considered the start of the secondary optic formed by or together with the deflector 97. The inner surface of the boss or extension and the inner surface of the deflector 97 may have similar specular reflective properties. As shown in FIG. 34, the fixture 90 may also include a trim ring 98 to facilitate a desired appearance when the fixture for example is mounted in a ceiling.

The solid state emitters in any of the fixtures discussed above may be driven by any known or available circuitry that is sufficient to provide adequate power to drive the emitters at the level or levels appropriate to the particular general lighting application of each particular fixture. Analog and digital circuits for controlling operations and driving the emitters are contemplated. Those skilled in the art should be familiar with various suitable circuits. However, for completeness, we will discuss an example of suitable circuitry, with reference to FIG. 35. That drawing figure is a block diagram of an exemplary solid state lighting system 100, including the control circuitry and the LED type sold state light emitters utilized as a light engine 101 in a fixture or lighting apparatus of such a system. Those skilled in the art will recognize that the system 100 of FIG. 35 may include a number of the solid state light engines 101. The light engine(s) 101 could be incorporated into a fixture in any of the examples discussed above, with the LEDs shown in FIG. 35 serving as the various solid state emitters in the exemplary fixture and the connections thereto provided via the flexible circuit board.

Figure 35:
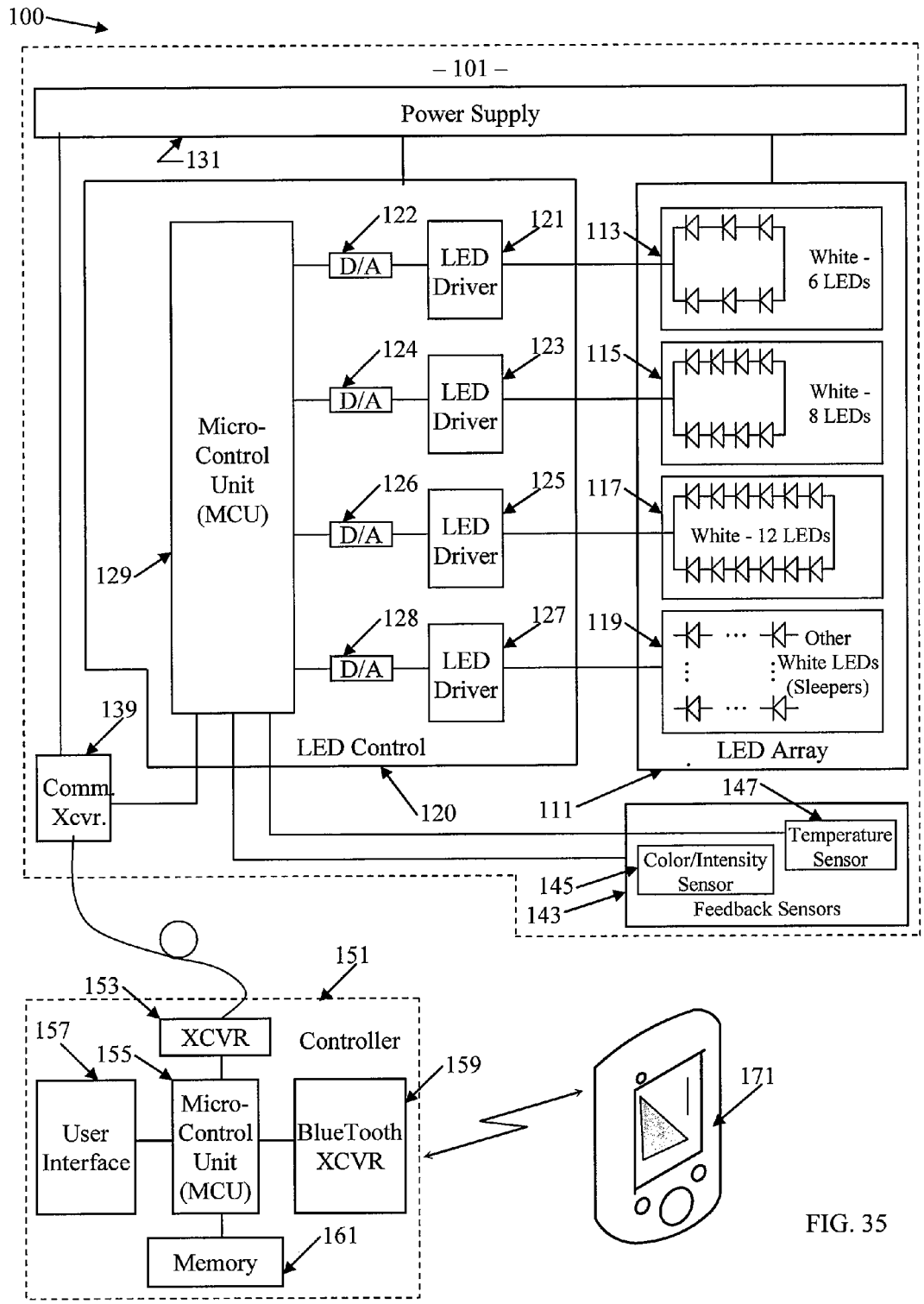
FIG. 35 is a functional block type circuit diagram, of an example of the solid state lighting elements as well as the driver circuitry, control and user interface elements which may be used with any of the fixture configurations to form an overall lighting system.

The circuitry of FIG. 35 provides digital programmable control of the light. Those skilled in the art will recognize that simpler electronics may be used for some fixture configurations, for example, an all white LED fixture with little or no variability may have only a power supply and an ON/OFF switch.

In the light engine 101 of FIG. 35, the set of solid state sources of light takes the form of a LED array 111. A circuit similar to that of FIG. 35 has been used in the past, for example, for RGB type lighting (see e.g. U.S. Pat. No. 6,995, 355) and could be used in a similar manner with LEDs of two or more colors. Different LED colors could be different primary colors or different color temperatures of white light. For a fixture that includes phosphors, the LEDs may be or include UV LEDs. However, for purposes of discussion of the main examples under consideration here, we will assume that the LEDs of the array 111 are all white LEDs rated for the same color temperature output.

Hence, the exemplary array 111 comprises one or more LEDs arranged in each of four different strings. Here, the array 111 includes three initially active strings of LEDs, represented by LED blocks 113, 115 and 117. The strings may have the same number of one or more LEDs, or the strings may have various combinations of different numbers of one or more LEDs. For purposes of discussion, we will assume that the first block or string of LEDs 113 comprises 6 LEDs. The LEDs may be connected in series, but in the example, two sets of 3 series connected LEDs are connected in parallel to form the block or string of 6 white LEDs 113. The LEDs may be considered as a first channel $C_1$, for control purposes.

In a similar fashion, the second block or string of LEDs 115 comprises 8 LEDs. The 8 LEDs may be connected in series, but in the example, two sets of 4 series connected LEDs are connected in parallel to form the block or string of 8 white LEDs 115. The third block or string of LEDs 117 comprises 12 LEDs. The 12 LEDs may be connected in series, but in the example, two sets of 6 series connected LEDs are connected in parallel to form the block or string of 12 white LEDs 117. The LEDs 115 may be considered as a second channel $C_2$, whereas the LEDs 117 may be considered as a third channel $C_3$, for control purposes.

The LED array 111 in this example also includes a number of additional or 'other' LEDs 119. As noted, some implementations may include various color LEDs, such as specific primary color LEDs, IR LEDs or UV LEDs, for various purposes. Another approach might use the LEDs 119 for a fourth channel to control output intensity. In the example, however, the additional LEDs 119 are 'sleepers.' Initially, the LEDs 113-117 would be generally active and operate in the normal range of intensity settings, whereas sleepers 119 initially would be inactive. Inactive LEDs are activated when needed, typically in response to feedback indicating a need for increased output (e.g. due to decreased performance of some or all of the originally active LEDs 113-117). The set of sleepers 119 may include any particular number and/or arrangement of the LEDs as deemed appropriate for a particular application.

Each string may be considered a solid state light emitting element coupled to supply light to the optical cavity, where each such element or string comprises one or more light emitting diodes (LEDs) serving as individual solid state emitters. In the example of FIG. 35, each such element or string 113 to 119 comprises a plurality of LEDs.

The electrical components shown in FIG. 35 also include a LED control system 120 as part of the light engine 101. The system 120 includes driver circuits 121 to 127 for the various LEDs 113 to 119, associated digital to analog (D/A) converters 122 to 128 and a programmable micro-control unit (MCU) 129. The driver circuits 121 to 127 supply electrical current to the respective LEDs 113 to 119 to cause the LEDs to emit visible light or other light energy (e.g. IR or UV). Each of the driver circuits may be implemented by a switched power regulator (e.g. Buck converter), where the regulated output is controlled by the appropriate signal from a respective D/A converter. The driver circuit 121 drives the string of LEDs 113, the driver circuit 123 drives the string of LEDs 115, and the driver circuit 125 drives the string of LEDs 117. In a similar fashion, when active, the driver circuit 127 provides electrical current to the other LEDs 119. If the other LEDs provide a single color of light, and are connected together, there may be a single driver circuit 127. If the LEDs are sleepers, it may be desirable to provide a separate driver circuit 127 for each of the LEDs 119, for each of two or more sets of similar LEDs, or for each set of LEDs of a different color.

The driver circuits supply electrical current at the respective levels for the individual sets of LEDs 113-119 to cause the LEDs to emit light. The MCU 129 controls the LED driver circuit 121 via the D/A converter 122, and the MCU 129 controls the LED driver circuit 123 via the D/A converter 124. Similarly, the MCU 129 controls the LED driver circuit 125 via the D/A converter 126. The amount of the emitted light of a given LED set or string is related to the level of current supplied by the respective driver circuit, as set by the MCU 129 through the respective D/A converter. Although not shown, controlled switches may be provided to allow the MCU to selectively activate/deactivate each of the strings 113-119 of LEDs.

In a similar fashion, the MCU 129 controls the LED driver circuit 127 via the D/A converter 128. When active, the driver circuit 127 provides electrical current to the other LEDs 119. If the LEDs are sleepers, it may be desirable to provide a separate driver circuit and A/D converter pair, for each of the LEDs 119 or for other sets of LEDs of the individual primary colors.

In operation, one of the D/A converters receives a command for a particular level, from the MCU 129. In response, the converter generates a corresponding analog control signal, which causes the associated LED driver circuit to generate a corresponding power level to drive the particular string of LEDs. The LEDs of the string in turn output light of a corresponding intensity. The D/A converter will continue to output the particular analog level, to set the LED intensity in accord with the last command from the MCU 129, until the MCU 129 issues a new command to the particular D/A converter.

The control circuit could modulate outputs of the LEDs by modulating the respective drive signals. In the example, the intensity of the emitted light of a given LED is proportional to the level of current supplied by the respective driver circuit. The current output of each driver circuit is controlled by the higher level logic of the system. In this digital control example, that logic is implemented by the programmable MCU 129, although those skilled in the art will recognize that the logic could take other forms, such as discrete logic components, an application specific integrated circuit (ASIC), etc.

The LED driver circuits and the MCU 129 receive power from a power supply 131, which is connected to an appropriate power source (not separately shown). For most general lighting applications, the power source will be an AC line current source, however, some applications may utilize DC power from a battery or the like. The power supply 131 converts the voltage and current from the source to the levels needed by the various elements of the LED control 120.

A programmable microcontroller, such as the MCU 129, typically comprises a programmable processor and includes or has coupled thereto random-access memory (RAM) for storing data and read-only memory (ROM) and/or electrically erasable read only memory (EEROM) for storing control programming and any pre-defined operational parameters, such as pre-established routines. In a white light system, the routine might vary overall intensity with time over some set period. In a system using multiple different colors of LEDs, a light 'recipe' or 'routine' might provide dynamic color variation. The MCU 129 itself comprises registers and other components for implementing a central processing unit (CPU) and possibly an associated arithmetic logic unit. The CPU implements the program to process data in the desired manner and thereby generates desired control outputs to cause the system to generate a virtual source of a desired output characteristic.

The MCU 129 is programmed to control the LED driver circuits 121-127 to set the individual output intensities of the LEDs to desired levels in response to predefined commands, so that the combined light emitted from the optical aperture or passage of the integrating volume has a desired intensity. Dimming, for example, may utilize control of the intensities of the individual stings of LEDs in the array 111. It is also contemplated that the MCU may implement a step-wise dimming function by ON-OFF control of the strings of white LEDs in various combinations, as discussed in more detail in U.S. Application Publication 2008/0224025 to Lyons et al. If there are two or more colors of white LEDs and/or different primary color LEDs, the intensity control by the MCU 129 may also control spectral characteristic(s) of the integrated light output.

The electrical components may also include one or more feedback sensors 143, to provide system performance measurements as feedback signals to the control logic, implemented in this example by the MCU 129, to insure that the desired performance is maintained or to facilitate color control or the like. A variety of different sensors may be used, alone or in combination, for different applications. In the illustrated examples, the set 143 of feedback sensors includes a color and/or intensity sensor 145 and a temperature sensor 147. Although not shown, other sensors may be used. The sensors are positioned in or around the fixture to measure the appropriate physical condition, e.g. temperature, color, intensity, etc. One or both of the illustrated sensors could be mounted on the flexible circuit board, for example, on one or more of the tabs.

In a system using RGB or other combinations of multiple color LEDs, the sensor 145 could provide color distribution feedback to the MCU 129. For discussion of the all-white example, we will assume that the sensor 145 is an intensity sensor. The light sensor 145 therefore provides intensity information to the MCU 129. A variety of different sensors are available, for use as the sensor 145. The light sensor 145 is coupled to detect intensity of the integrated light, either as emitted through the aperture or as integrated within the volume of the optical cavity, e.g. in cavity 2 in the example of FIG. 1. The sensor 145 may be mounted alongside the LEDs for directly receiving light processed within the cavity. However, some small amount of the integrated light passes through a point on a wall of the cavity, e.g. through the Valar® reflector, therefore it may be sufficient to sense light intensity at that point on the cavity wall.

The MCU 129 uses the intensity feedback information to determine when to activate the sleeper LEDs 119. The intensity feedback information may also cause the MCU 129 to adjust the constant current levels applied to the LEDs 113 to 117 in the control channels $C_1$ to $C_3$, to provide some degree of compensation for declining performance before it becomes necessary to activate the sleepers 119.

The temperature sensor 147 may be a simple thermo-electric transducer with an associated analog to digital converter, or any of a variety of other temperature detectors may be used. The temperature sensor is positioned on or inside of the fixture, typically at a point that is near the LEDs or other sources that produce most of the system heat. The temperature sensor 147 provides a signal representing the measured temperature to the MCU 129. The system logic, here implemented by the MCU 129, can adjust intensity of one or more of the LEDs of array 111 in response to the sensed temperature, e.g. to reduce intensity of the source outputs to compensate for temperature increases. For example, if temperature is increasing due to increased drive current to the active LEDs (with increased age or heat), the controller may deactivate one or more of those LEDs and activate a corresponding number of the sleepers, since the newly activated sleeper(s) will provide similar output in response to lower current and thus produce less heat.

In a typical general lighting application, in say an architectural setting, the fixture and associated solid state light engine 101 will be mounted or otherwise installed at a location of desired illumination. The light engine 101, however, will be activated and controlled by a controller 151, which may be at a separate location. For example, if the fixture containing the light engine 101 is installed in the ceiling of a room as a downlight for a task or area illumination type application, the controller 151 might be mounted in a wall box near a door into the room, much like the mounting of a conventional ON-OFF or dimmer type wall switch for an incandescent or fluorescent light fixture. Those skilled in the art will recognize that the controller 151 may be mounted in close proximity to or integrated into the light engine 101. In some cases, the controller 151 may be at a substantial distance from fixture that incorporates the light engine. It is also conceivable that the separate controller 151 may be eliminated and the functionality implemented by a user interface on the light engine in combination with further programming of the MCU 129 (see e.g. the above cited U.S. Pat. No. 6,995,355).

The circuitry of the light engine 101 includes a wired communication interface or transceiver 139 that enables communications to and/or from a transceiver 153, which provides communications with the micro-control unit (MCU) 155 in the controller 151. Typically, the controller 151 will include one or more input and/or output elements for implementing a user interface 157. The user interface 157 may be as simple as a rotary switch or a set of pushbuttons, e.g. to control ON- OFF state and set the brightness or intensity level (dimming control). As another example, the controller 151 may also include a wireless transceiver, in this case, in the form of a Bluetooth transceiver 159. A number of light engines 101 of the type shown may connect over common wiring, so that one controller 151 through its transceiver 153 can provide instructions via interfaces 139 to the MCUs 129 in several such light engines, thereby providing common control of a number of light fixtures.

A programmable microcontroller, such as the MCU 155, typically comprises a programmable processor and includes or has coupled thereto random-access memory (RAM) for storing data and read-only memory (ROM) and/or electrically erasable read only memory (EEROM) for storing control programming and any pre-defined operational parameters, such as pre-established light 'routines.' In the example, the controller 151 is shown as having a memory 161, which will store programming and control data. The MCU 155 itself comprises registers and other components for implementing a central processing unit (CPU) and possibly an associated arithmetic logic unit. The CPU implements the program to process data in the desired manner and thereby generates desired control outputs to cause the controller 151 to generate commands to one or more light engines 100 to provide general lighting operations of the one or more controlled light fixtures.

The MCU 155 may be programmed to essentially establish and maintain or preset a desired 'recipe' or mixture of the intensities for the various LED light strings in array 111 to provide a selected overall output intensity or brightness. For a multi-color implementation, the MCU 155 may be programmed to essentially establish and maintain or preset a desired 'recipe' or mixture of the available wavelengths provided by the LEDs used in the particular system, to provide a desired spectral setting as well. For a given intensity setting (and/or color setting), the MCU 155 will cause the transceiver 139 to send the appropriate command or commands to the MCU 129 in the one or more light engines 101 under its control. Each fixture 1 incorporating such a light engine 101, which receives such an instruction, will implement the indicated setting and maintain the setting until instructed to change to a new setting. For some applications, the MCU 155 may work through a number of settings over a period of time in a manner defined by a dynamic routine. Data for such recipes or routines may be stored in the memory 161.

As noted, the controller 151 includes a Bluetooth type wireless transceiver 159 coupled to the MCU 155. The transceiver 159 supports two-way data communication in accord with the standard Bluetooth protocol. For purposes of the present discussion, this wireless communication link facilitates data communication with a personal digital assistant (PDA) 171. The PDA 171 is programmed to provide user input, programming and attendant program control of the system 100, for example, to allow a user to remotely control any number of the systems/fixtures.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light fixture for providing general lighting in a region or area intended to be occupied by a person, the fixture comprising:
   a light transmissive structure forming a volume, the structure having a contoured outer surface, an optical aperture surface and a peripheral optical coupling surface between the contoured outer surface and the optical aperture surface, the peripheral optical coupling surface forming an obtuse angle with respect to the optical aperture surface;
   a reflector having a diffusely reflective interior surface extending over at least a substantial portion of the contoured outer surface of the light transmissive structure to form an optical cavity including the volume of the light transmissive structure, a portion of the aperture surface of the light transmissive structure forming an optical aperture of the cavity;
   a heat sink member having an inner peripheral portion of a size somewhat larger than the outer peripheral portion of the light transmissive structure and having an inner surface at an angle at least substantially corresponding to the angle formed by the peripheral optical coupling surface of the light transmissive structure;
   a flexible circuit board, the flexible circuit board comprising:
   (a) a mounting section mounted on the heat sink member, and
   (b) at least one flexible tab attached to and extending from the mounting section of the flexible circuit board, each flexible tab being bent around the heat sink member and positioned between the angled inner surface of the inner peripheral portion of the heat sink member and the angled peripheral optical coupling surface of the light transmissive structure; and
   one or more solid state light emitters, for producing light intensity sufficient for a general lighting application of the fixture, at least one solid state light emitter being mounted on a respective tab of the flexible circuit board and positioned by the respective tab between the respective tab and the angled peripheral optical coupling surface of the outer peripheral portion of the light transmissive structure,
   wherein the respective tab holds said at least one solid state light emitter against the peripheral optical coupling surface of the light transmissive structure for emission of light through the peripheral optical coupling surface into the volume formed by the light transmissive structure.

2. The light fixture of claim 1, wherein at least a substantial portion of the contoured outer surface of the light transmissive structure has a roughened or etched texture.

3. The light fixture of claim 2, wherein at least any portion of the angled peripheral optical coupling surface of the light transmissive structure receiving light from the one or more solid state light emitters is highly transparent.

4. The light fixture of claim 1, wherein at least a substantial portion of the optical aperture surface of the light transmissive structure has a roughened or etched texture.

5. The light fixture of claim 4, wherein at least any portion of the angled peripheral optical coupling surface of the light transmissive structure receiving light from the one or more solid state light emitters is highly transparent.

6. The light fixture of claim 5, wherein at least a substantial portion of the contoured outer surface of the light transmissive structure has a roughened or etched texture.

7. The light fixture of claim 1, further comprising:
   thermal interface material (TIM) positioned between the respective tab and the angled inner surface of the inner peripheral portion of the heat sink member, for providing electrical insulation between the respective tab and the heat sink member and for providing thermal conductivity to the heat sink member;

wherein pressure created by contact of the at least one solid state light emitter with the outer peripheral optical coupling surface of the light transmissive structure compresses the TIM against the heat sink member.

8. The light fixture of claim 7, further comprising:
one or more vias formed through the respective tab, from a first surface of the respective tab supporting the at least one solid state light emitter to an opposite second surface of the respective tab; and
heat conductive material extending through each via, to conduct heat from each solid state light emitter on the respective tab.

9. The light fixture of claim 8, further comprising:
heat conductive material forming a first pad on the first surface of the respective tab, in contact with each light emitter on the respective tab; and
heat conductive material forming a second pad on the second surface of the respective tab and in contact with the angled inner surface of the inner peripheral portion of the heat sink member,
wherein the heat conductive material extending through each via through the respective tab conducts heat from each solid state light emitter on the respective tab from the first pad on the respective tab to the second pad on the respective tab for transfer to the heat sink member.

10. The light fixture of claim 1, wherein each solid state light emitter comprises a light emitting diode (LED).

11. The light fixture of claim 10, wherein each LED is a white LED.

12. The light fixture of claim 1, wherein the light transmissive structure comprises a light transmissive solid, at least substantially filling the volume of the light transmissive structure.

13. The light fixture of claim 12, wherein:
the light transmissive solid comprises two light transmissive sections joined together with a gap therebetween; and
the light fixture further comprises a phosphor contained in the gap between the two sections of the light transmissive solid.

14. The light fixture of claim 13, wherein at least one of the light transmissive sections is located at the optical aperture surface of the light transmissive structure.

15. The light fixture of claim 1, wherein the light transmissive structure comprises a container filled with a liquid.

16. The light fixture of claim 15, wherein the liquid contains a phosphor.

17. The light fixture of claim 1, wherein diffuse reflections of light within the volume of the light transmissive structure optically integrate light from the one or more solid state light emitters, for emission of optically integrated light through an optical aperture of the fixture at the aperture surface of the light transmissive structure.

18. The light fixture of claim 17, wherein the respective tab holds said at least one solid state light emitter against the peripheral optical coupling surface of the light transmissive structure for emission of light through the peripheral optical coupling surface in such an orientation that the aperture surface of the light transmissive structure reflects a portion of direct emissions from each of the solid state light emitters back into the optical cavity by total internal reflection, for subsequent diffuse reflection off of the reflector for optical integration within the cavity before emission through the optical aperture.

19. The light fixture of claim 18, further comprising:
a mask having a reflective surface facing inward with respect to the volume, covering a portion of the aperture surface of the light transmissive structure in proximity to the solid state light emitters,
wherein the optical aperture is formed by a portion of the aperture surface not covered by the mask.

20. The light fixture of claim 18, wherein the respective tab holds said at least one solid state light emitter against the peripheral optical coupling surface of the light transmissive structure for emission of light through the peripheral optical coupling surface in such an orientation that the central axis of emission of each light emitter is substantially at an acute angle relative to the axis of the aperture surface of the light transmissive structure and inclined somewhat away from the aperture surface of the light transmissive structure.

21. The light fixture of claim 20, wherein:
the obtuse angle of the peripheral optical coupling surface with respect to the optical aperture surface of light transmissive structure is approximately 120°; and
the acute angle of the central axis of emission of each light emitter relative to the axis of the aperture surface of the light transmissive structure approximately 60°.

22. The light fixture of claim 21, wherein:
the volume of the light transmissive structure has a shape corresponding to a substantial section of a sphere;
the outer peripheral portion of the structure along the contoured surface of the light transmissive structure is circular about said axis;
an inner peripheral portion of the mounting section of the flexible circuit board is circular; and
the inner peripheral portion of the heat sink member is circular.

23. The light fixture of claim 1, further comprising an optical grease, glue or gel between the peripheral optical coupling surface of the light transmissive structure and at least one solid state light emitter for providing refractive index matching relative to a material of the light transmissive structure forming at least the angled peripheral optical coupling surface.

24. The light fixture of claim 1 in combination with circuitry for driving the solid state light emitters to generate light.

25. The light fixture of claim 24, wherein the flexible circuit board includes a strip extending away from the mounting section of the flexible circuit board providing electrical connections to the circuitry.

26. A solid state lighting system for providing general lighting in a region or area intended to be occupied by a person, comprising a light fixture and drive circuitry,
the fixture comprising:
a light transmissive structure forming a volume, the structure having a contoured outer surface and an optical aperture surface;
a reflector having a diffusely reflective interior surface extending over at least a substantial portion of the contoured outer surface of the light transmissive structure to form an optical cavity including the volume of the light transmissive structure, a portion of the aperture surface of the light transmissive structure forming an optical aperture of the cavity;
a heat sink member having an inner peripheral portion of a size somewhat larger than an outer peripheral portion of the light transmissive structure and having an inner surface at least substantially conforming in shape to the outer peripheral portion of the light transmissive structure;

a flexible circuit board, the flexible circuit board comprising:
(a) a mounting section mounted on the heat sink member,
(b) a strip extending from the mounting section of the flexible circuit board providing electrical connections to the drive circuitry, and
(c) at least one flexible tab attached to and extending from the mounting section of the flexible circuit board, each flexible tab being bent around the heat sink member and positioned between the inner surface of the inner peripheral portion of the heat sink member and the outer peripheral portion of the light transmissive structure; and one or more solid state light emitters, for producing light intensity sufficient for a general lighting application of the fixture, at least one solid state light emitter being mounted on a respective tab of the flexible circuit board and positioned by the respective tab between respective tab and the outer peripheral portion of the light transmissive structure, wherein the respective tab holds said at least one solid state light emitter against the outer peripheral portion of the light transmissive structure for emission of light into the volume formed by the light transmissive structure.

* * * * *